(12) United States Patent
Haq et al.

(10) Patent No.: US 7,123,660 B2
(45) Date of Patent: Oct. 17, 2006

(54) METHOD AND SYSTEM FOR DESKEWING PARALLEL BUS CHANNELS TO INCREASE DATA TRANSFER RATES

(75) Inventors: Ejaz Ul Haq, Sunnyvale, CA (US); James R. Slager, Saratoga, CA (US)

(73) Assignee: Jazio, Inc., CA (US)

( * ) Notice: Subject to any disclaimer, the term of this patent is extended or adjusted under 35 U.S.C. 154(b) by 1038 days.

(21) Appl. No.: 10/086,594

(22) Filed: Feb. 27, 2002

(65) Prior Publication Data

US 2002/0186717 A1 Dec. 12, 2002

Related U.S. Application Data

(60) Provisional application No. 60/272,222, filed on Feb. 27, 2001.

(51) Int. Cl.
*H04L 25/00* (2006.01)
*H04B 15/00* (2006.01)
(52) U.S. Cl. .................. 375/257; 375/285; 375/371
(58) Field of Classification Search ................ 375/257, 375/258, 316, 285, 346, 219, 222, 224, 226, 375/259, 371; 330/252; 333/156, 150
See application file for complete search history.

(56) References Cited

U.S. PATENT DOCUMENTS

| | | | |
|---|---|---|---|
| 3,737,788 A | 6/1973 | Lenz | |
| 4,247,817 A | 1/1981 | Heller | |
| 4,663,769 A | 5/1987 | Krinock | |
| 4,675,558 A | 6/1987 | Serrone et al. | |
| 4,713,827 A | 12/1987 | Lauffer et al. | |
| 4,745,365 A | 5/1988 | Ugenti | |
| 4,782,481 A | 11/1988 | Eaton | |
| 4,792,845 A | 12/1988 | Judge | |
| 4,942,365 A | 7/1990 | Satterwhite | |
| 5,023,488 A | 6/1991 | Gunning | |
| 5,105,107 A | 4/1992 | Wilcox | |

(Continued)

FOREIGN PATENT DOCUMENTS

WO WO 92/17938 10/1992

OTHER PUBLICATIONS

"IEEE Standard for Low-Voltage Differential Signals (LVDS) for Scalable Coherent Interface (SCI)", IEEE Std. 1596.3-1996, Mar. 21, 1996, XP-002106653, Introduction, Contents and pp. 1-30.
4M×18 SLDRAM Preliminary Data Sheet Sep. 1997 from SLDRAM Consortium.

(Continued)

*Primary Examiner*—Tesfaldet Bocure
(74) *Attorney, Agent, or Firm*—Brown Raysman, et al

(57) ABSTRACT

In one embodiment, a system for deskewing signals on parallel bus channels includes several parallel channels that carry several data input signals and a pair of complementary voltage and timing reference (VTR) signals. The system also includes several receivers, with each receiver coupled to receive a data input signal and the pair of complementary VTR signals. The output of each receiver is based in part on a comparison of the received data input signal with the pair of complementary VTR signals. In one embodiment, a pair of VTR signals is selected from several pairs of VTR signals to widen the skew band on each channel. In one embodiment, each channel is skewed using a programmable delay circuit having a delay value based on the alignment of a data input signal relative to a pair of complementary VTR signals.

11 Claims, 19 Drawing Sheets

U.S. PATENT DOCUMENTS

| | | |
|---|---|---|
| 5,142,556 A | 8/1992 | Ito |
| 5,243,703 A | 9/1993 | Farmwald et al. |
| 5,254,883 A | 10/1993 | Horowitz et al. |
| 5,263,049 A | 11/1993 | Wincn |
| 5,319,755 A | 6/1994 | Farmwald et al. |
| 5,327,121 A | 7/1994 | Antles, II |
| 5,355,391 A | 10/1994 | Horowitz et al. |
| 5,363,332 A | 11/1994 | Murabayashi et al. |
| 5,378,946 A | 1/1995 | Reime |
| 5,408,129 A | 4/1995 | Farmwald et al. |
| 5,432,823 A | 7/1995 | Gasbarro et al. |
| 5,463,211 A | 10/1995 | Arends et al. |
| 5,473,575 A | 12/1995 | Farmwald et al. |
| 5,473,635 A | 12/1995 | Chevroulet |
| 5,473,757 A | 12/1995 | Sexton |
| 5,483,110 A | 1/1996 | Koide et al. |
| 5,498,985 A | 3/1996 | Parle et al. |
| 5,512,853 A | 4/1996 | Ueno et al. |
| 5,513,327 A | 4/1996 | Farmwald et al. |
| 5,513,377 A | 4/1996 | Capowski et al. |
| 5,550,496 A | 8/1996 | Desroches |
| 5,579,492 A | 11/1996 | Gay |
| 5,590,369 A | 12/1996 | Burgess et al. |
| 5,606,717 A | 2/1997 | Farmwald et al. |
| 5,646,642 A | 7/1997 | Maekawa et al. |
| 5,666,354 A * | 9/1997 | Cecchi et al. ............... 370/284 |
| 5,706,484 A | 1/1998 | Mozdzen et al. |
| 5,706,485 A | 1/1998 | Barkatullah et al. |
| 5,715,405 A | 2/1998 | McClear et al. |
| 5,774,354 A | 6/1998 | Ohta |
| 5,796,962 A | 8/1998 | Fant et al. |
| 5,812,875 A | 9/1998 | Eneboe |
| 5,815,734 A | 9/1998 | Lee et al. |
| 5,878,234 A | 3/1999 | Dutkiewicz et al. |
| 5,925,118 A | 7/1999 | Revilla et al. |
| 5,928,343 A | 7/1999 | Farmwald et al. |
| 5,963,070 A | 10/1999 | Faulkner et al. |
| 6,122,331 A | 9/2000 | Dumas |
| 6,151,648 A | 11/2000 | Haq |
| 6,160,423 A | 12/2000 | Haq |
| 6,327,205 B1 * | 12/2001 | Haq ........................... 365/219 |
| 6,430,606 B1 | 8/2002 | Haq |
| 2002/0152340 A1 * | 10/2002 | Dreps et al. ................ 710/100 |
| 2005/0212564 A1 * | 9/2005 | Gabillard et al. ............. 327/94 |

OTHER PUBLICATIONS

1M×16Bit×4 Banks DDR SDRAM (Rev. 0.5 Jun. 1997) from Samsung.

Kim, et al. "A 640MB/s Bi-Directional Data Strobed, Double-Data-Rate SDRAM with a 40mW DLL Circuit for a 256MB Memory System", ISSCC98 Digest, pp. 158-159, Feb. 6, 1998.

Morooka, et al. "Source Synchronization and Timing Vernier Techniques for 1.2GB/s SLDRAM Interface", ISSCC98 Digest, pp. 160-161, Feb. 6, 1998.

Lau, et al. "A 2.6 GB/s Multi-Purpose Chip-to-Chip Interface", ISSCC98 Digest, pp. 162-163, Feb. 6, 1998.

LVDS I/O (Scalable Coherenet Interface Documents) IEEE P1596.3 working-group activity for high-speed signal link interface, 3 pages.

Hyper-LVDS I/O Cell (LSI Logic Product Briefs), 2 pages.

Crisp, Richard, "Direct Rambus Technology: The New Main Memory Standard", Nov./Dec. 1997.

Direct RDRAM 64/72-Mbit (256K×16/18×16d), "Advance Information" of 64M/72M Direct RDRAM Data Sheet, dated Oct. 2, 1997.

Tamura, et al. "PRD-Based Global-Mean-Time Signaling for High-Speed Chip-to-Chip Communications", ISSCC98 Digest, pp. 164-165 & pp. 430-432; Feb. 6, 1998.

Griffin, et al. "A process Independent 800MB/s DRAM Bytewide Interface Featuring Command Interleaving and Concurrent Memory Operation", ISSCC98 Digest, pp. 156-157, Feb. 6, 1998.

RamLink, LVDS I/O (Scablable Coherent Interface Documents) IEEE P1596.4 working-group activity for high-speed signal link interface, 3 pages.

XILINX® Application Note: "Using the Virtex SelectIO", XAPP 133 Oct. 21, 1998 (Version 1.11), 12 pages.

Rambus®, Rambus® Technology Overview, including Introduction and The Rambus Solution, Copyright Feb. 1999, last modified: Feb. 12, 1999, 5 pages.

Haq, Ejaz, et al.; "Jazio Signal-Switching Technology—A Low-Cost Digital I/O for High-Speed Applications"; IEEE Micro; Jan.-Feb. 2001; pp. 72-81.

"Jazio Enhancements To Achieve Very High Data Rates Per Pin For Parallel Interfaces"; Jazio High Speed Digital I/O Signal Switching Technology; Jun. 20, 2001; 14 pages.

* cited by examiner

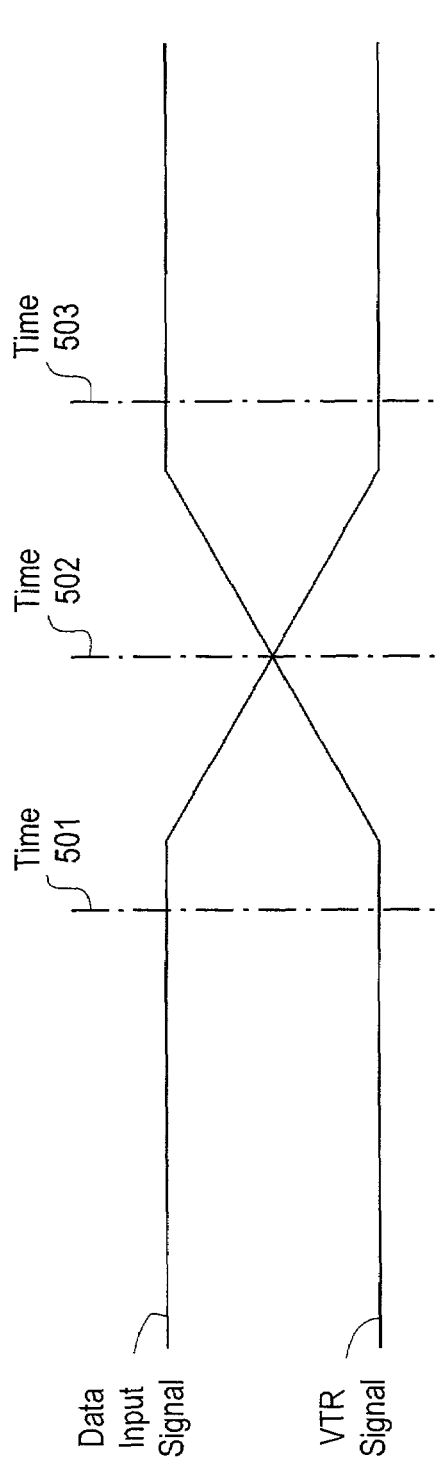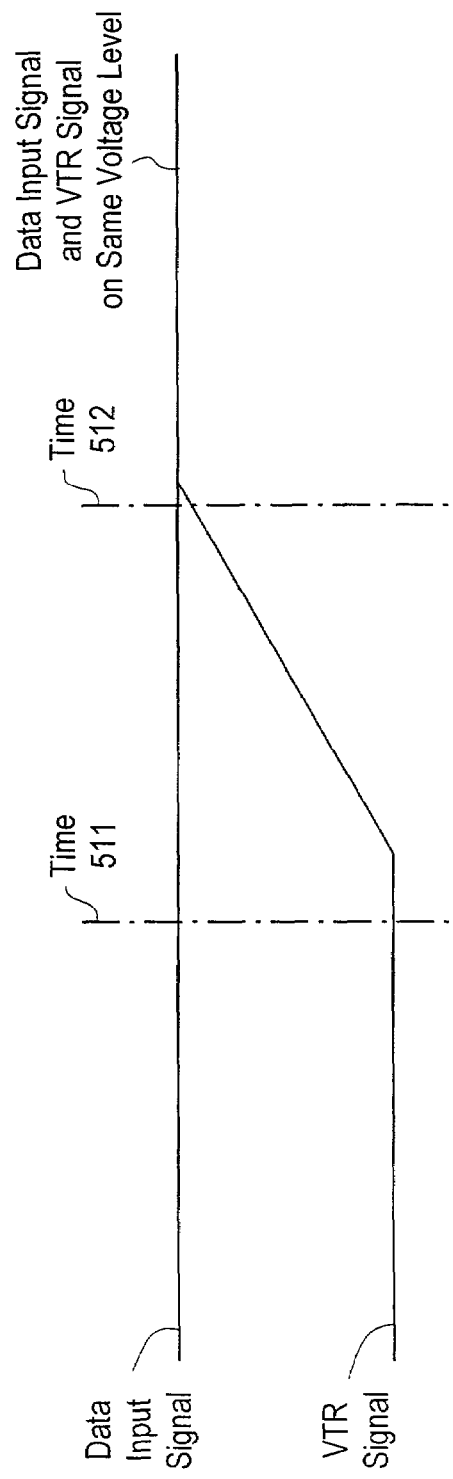

METHOD AND SYSTEM FOR DESKEWING PARALLEL BUS CHANNELS TO INCREASE DATA TRANSFER RATES

CROSS-REFERENCE TO RELATED APPLICATION

This application claims the benefit of U.S. Provisional Application No. 60/272,222, filed Feb. 27, 2001, entitled "Method And Systems For Deskewing Parallel Bus Channels To Increase Data Transfer Speed." The just-mentioned provisional application was filed by the inventors of the present application, and is incorporated herein by reference in its entirety.

BACKGROUND OF THE INVENTION

1. Field of the Invention

The present invention relates generally to data communications, and more particularly to parallel data communications in digital systems.

2. Description of the Background Art

Data is typically transferred between electronic devices by changing the data signal (e.g. current or voltage level) transmitted over a conductive wire or other coupling mechanism for conducting such transmission. Data transmission in which a group of data bits moves concurrently over several channels is referred to as parallel transmission, while data transmission in which data bits move over a single channel, one after the other, is referred to as serial transmission.

Parallel transmission, being generally faster than serial transmission, is widely used in applications where the length of the channel is relatively short, e.g., a bus connecting integrated circuits on a printed circuit board, a connection between a printer and a personal computer, communication between closely located systems, etc. However, parallel transmission over long distances can be affected by different propagation delays in the parallel channels. This difference, when it exists, causes the arrival times of individual data bits at the destination receiver to be different, and the difference in arrival times is referred to as "skew".

Skew is generally not disruptive in applications where the channel lengths are kept relatively short and the data transfer speeds are slow. However, as channel lengths or data transfer speeds are increased, the propagation delay on individual channels accumulates, thereby increasing the duration and effect of the skew. A sufficiently large skew can further cause data bits from one word to drift into the data bits of the next word, resulting in data transmission errors.

Various approaches exist for addressing skew-related problems in conventionally configured systems. One approach is to create individual serial data bit streams from the data in each channel. This approach involves encoding a clock signal into the transmitted bit stream at the transmitter, and then using signal processing techniques at the receiver to recover the clock signal and reconstruct successive data words. Unfortunately, the additional encoded clock data utilizes valuable channel bandwidth of each channel during transmission, and requires complex signal processing at the receiver.

Another approach, which is employed in modems, is to perform a complex set of durational analyses using test signal patterns on each of the parallel channels. The tests are designed to reveal a "characteristic skew" of each channel. Compensation or filter circuits are then used to compensate for the determined durational variance for each channel. This approach, however, is also problematic in that the propagation delays causing the skew can be dynamically affected by a significant number of variables, such as temperature, voltage, etc., which variables are themselves in constant flux. Hence, the tests are not sufficiently accurate over a longer period of time. To compensate for this, data transmission is frequently interrupted for relatively extensive periods of time in order to effectively take the system offline (with regard to "live" data), inject the test patterns and conduct the durational tests in an ongoing manner. Consequently, data transmission rates suffer.

Another approach involves "hand tuning" individual wires of a wire bundle and then painstakingly assembling the hand-tuned wires into a data transmission cable. This scheme does mitigate the skew problem somewhat by allowing longer cables to be produced without exceeding certain maximum acceptable durations of channel skew. It does not, however, address the root of the problem and can only achieve marginal improvements in channel length. The resulting cables are also very expensive in comparison to the benefit they confer, making them unsuitable for general widespread use.

As was already noted, the above approaches have been developed according to conventional data communication systems, in which the transmitted data signal (e.g. voltage level) for each received bit of data is detected against a fixed reference voltage (e.g. d.c. reference voltage). The approaches have also been widely adopted for differential signal switching in which the receiver digitizes small swing signal to full power supply rails for each channel regardless of skew (assuming the differential pair has limited skew compared to all channels in the parallel bus). Some have also been adopted for pseudo-differential signal switching, in which the receiver digitizes the small swing signal to full swings using a fixed voltage reference regardless of skew.

Unfortunately, as was also noted, each of the above approaches is also problematic with regard to even the particular systems for which they were developed.

Accordingly, there is a need for systems and methods capable of enabling a more accurate and reliable manner of detecting, or further, compensating for skew distortion, and thereby providing for more reliable transmission and reception of signals (including parallel data channels) over longer distances, at higher frequency or both. There is also a need for such systems and methods that are capable of conducting such detecting and/or compensating with minimal detrimental impact on channel bandwidth, and further, with minimal added implementation costs and complexity.

SUMMARY

The present invention relates to improved systems and methods for deskewing parallel signal channels. Embodiments of the invention are capable of more accurately and reliably detecting/compensating for or otherwise correcting skew distortion with little or no detrimental impact on channel bandwidth, and further, with minimal added implementation costs and complexity. Embodiments are also capable of being used in a wide variety of applications, including but not limited to individual or combined use in memories, chipsets, central processing units ("CPUs") network and other processors and controllers, CPU front side, memory, interchip and other buses, peripheral cables and other interconnects, and application specific integrated circuit ("ASIC") devices, among numerous others.

Embodiments of the invention, while otherwise useful and applicable, are particularly suitable for use in conjunction with systems including parallel signal channels that carry data input signals and at least one pair of complementary voltage and timing reference ("VTR") signals. The system also includes receivers, with each receiver being coupleable to receive one or more of the data input signals and the at least one VTR signal pair, the output of each receiver being based in part on a comparison of a received data input signal with the at least one complementary VTR signal pair. The detection and correction system and method embodiments are further capable of being used individually, in conjunction with other detection/correction mechanisms, or in various combinations in whole or part.

In one embodiment, skew distortion is detected and a pair of VTR signals is selected from two or more VTR pairs as being capable of correcting the skew distortion.

In another embodiment, an alignment monitor provides for detecting one or more misalignment incidents in which a signal level change of the received data leads or lags a predetermined VTR signal level change (or where the data signal level change leads or lags a signal level change of prior received data), and for flagging such misalignments as one or more corresponding skew occurrences. The skew monitor can further provide for determining a number of such misalignments, and can still further provide for correcting further skew occurrences using one or more of the systems/methods discussed herein, one or more other such correction systems/methods or some combination, in whole or part.

In another embodiment, a programmable delay circuit is coupled to each channel to skew the signals on that channel. The delay value in the programmable delay circuit is based on the alignment of a data input signal relative to a pair of complementary VTR signals. The delay value may be determined during start-up or during normal operation using an alignment monitor circuit.

These and other features and aspects of the present invention will be readily apparent to persons of ordinary skill in the art upon reading the entirety of this disclosure, which includes the accompanying drawings and claims.

DESCRIPTION OF THE DRAWINGS

FIGS. 5A and 5B show waveforms illustrating the change/no-change concept of the present invention;

Figure 1A:
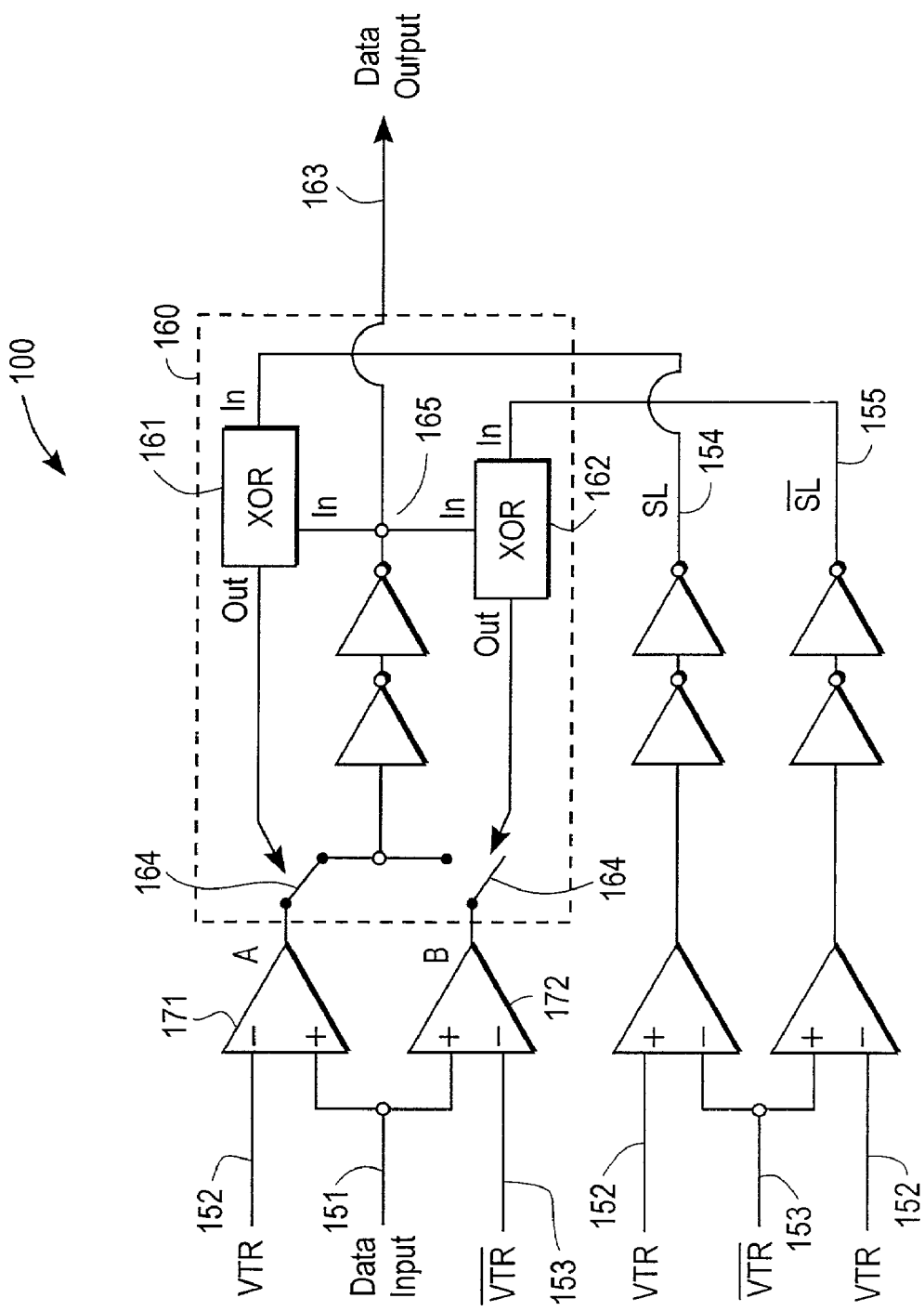
FIG. 1A shows a simplified schematic diagram of a receiver in accordance with an embodiment of the present invention.

The use of the same reference labels in different drawings indicates the same or like components.

DETAILED DESCRIPTION

The present invention relates to improved systems and methods for deskewing parallel input signal channels, including data channels for carrying voltage-varying data signals, and further, such data channels of one or more wired buses. Embodiments provide for detecting skewing, accommodating or otherwise correcting (detected) skewing, and combinations thereof, among other features.

In one embodiment, the present invention is used in conjunction with a time variable voltage reference scheme such as the Jazio signal-switching technology discussed in the article entitled "Jazio Signal-Switching Technology", IEEE MICRO, January/February 2001, pp. 72–81. In contrast to conventional differential signal switching schemes, Jazio minimizes pin usage by using a single pair of voltage and timing reference signals for amplifying a group of signals on different channels. Jazio provides for detecting a change or no change from a preceding state, instead of the traditional comparison of a data signal level (e.g. a high or low voltage level) with a reference signal level (e.g., a d.c. reference voltage).

The Jazio signal-switching technology is also discussed in the following commonly-owned disclosures, which are incorporated herein by reference in their entirety: U.S. patent application Ser. No. 09/578,354, entitled "Signal Latching Of High Bandwidth DRAM Arrays When Skew Between Different Components Is Higher Than Signal Rate," filed on May 24, 2000, by Ejaz Ul Haq; U.S. Provisional Application No. 60/078,213, entitled "High Speed Source Synchronous Signaling For Interfacing VLSI CMOS Circuits To Transmission Lines," filed on Mar. 16, 1998, by Ejaz Ul Haq; U.S. patent application Ser. No. 09/057,158, now U.S. Pat. No. 6,160,423, entitled "High Speed Source Synchronous Signaling For Interfacing VLSI CMOS Circuits To Transmission Lines," filed on Apr. 7, 1998, by Ejaz Ul Haq; U.S. patent application Ser. No. 09/165,705, now U.S. Pat. No. 6,151,648, entitled "High Speed Signaling for Interfacing VLSI CMOS circuits," filed on Oct. 2, 1998, by Ejaz Ul Haq; U.S. patent application Ser. No. 09/318,690, entitled "High Speed Signaling for Interfacing VLSI CMOS Circuits," filed on May 25, 1999, by Ejaz Ul Haq; and U.S. Provisional Application Ser. No. 60/180,236, entitled "Signal Latching of High Bandwidth DRAM Arrays When Skew Between Different Components is Higher than Signal Rate," filed on Feb. 4, 2000, by Ejaz Ul Haq.

(For greater clarity and so that aspects of the invention might be better understood, the remainder of the discussion will focus primarily on embodiments of the invention as utilized in conjunction with the Jazio technology. Those skilled in the art will appreciate, however, that various embodiments of such aspects might also be applicable, alone or in combination, to systems that do not employ the Jazio signal-switching technology or that employ the Jazio technology and other system alternatives, and can also be used in conjunction with such system alternatives, the Jazio technology or some combination, in whole or part.)

FIG. 1A shows a simplified schematic diagram of a Jazio receiver 100 in accordance with an embodiment of the present invention. In a point-to-point connection between two devices, receiver 100 will be on the receiving device, while a Jazio transmitter (not shown) will be on the transmitting device. Referring to FIG. 1A, data input signal 151, which may be a single bit or series of bits, is transmitted from the Jazio transmitter. A pair of complementary voltage and timing reference (VTR) signals, VTR signal 152 and /VTR signal 153, is also transmitted by the Jazio transmitter. Note that in the present disclosure, a "/" precedes an active-low signal (e.g., /VTR) and is equivalent to an over-bar symbol (e.g., $\overline{VTR}$).

Data input signal 151 is compared against VTR signal 152 using differential comparator 171, and against /VTR signal 153 using differential comparator 172. The output signals of comparators 171 and 172 are provided to steering logic 160. Steering logic 160 functions as a multiplexer: it couples to output node 165 either the output of comparator 171 or comparator 172 depending on the previous state of data input signal 151.

The Jazio transmitter and receiver are initialized prior to signal transmission. At initialization, data input signal 151 is set to logical HIGH, VTR signal 152 is set to logical LOW, and /VTR signal 153 is set to logical HIGH. VTR signal 152 and /VTR signal 153 toggle (i.e., transition to the opposite state) every time a data input signal is transmitted. Just after initialization, VTR signal 152 (currently LOW) and data input signal 151 (currently HIGH) have opposite states, and thus provide a full differential signal (e.g., 0.5 V) to the inputs of comparator 171. Because steering logic 160 selects the comparator with full differential input, steering logic 160 selects comparator 171 by coupling the output of comparator 171 to output node 165. Thereafter, steering logic 160 will select comparator 171 again if data input signal 151 toggles. Otherwise, i.e., when data input signal 151 does not change state, steering logic 160 will first deselect comparator 171 by disconnecting the output of comparator 171 from output node 165, and then select comparator 172 by coupling the output of comparator 172 to output node 165. In effect, steering logic 160 selects and deselects comparators depending on whether data input signal 151 toggles or not. If data input signal 151 toggles, the previously selected comparator is again selected; otherwise, the previously selected comparator is first deselected, and the other comparator is selected.

Figure 1B:
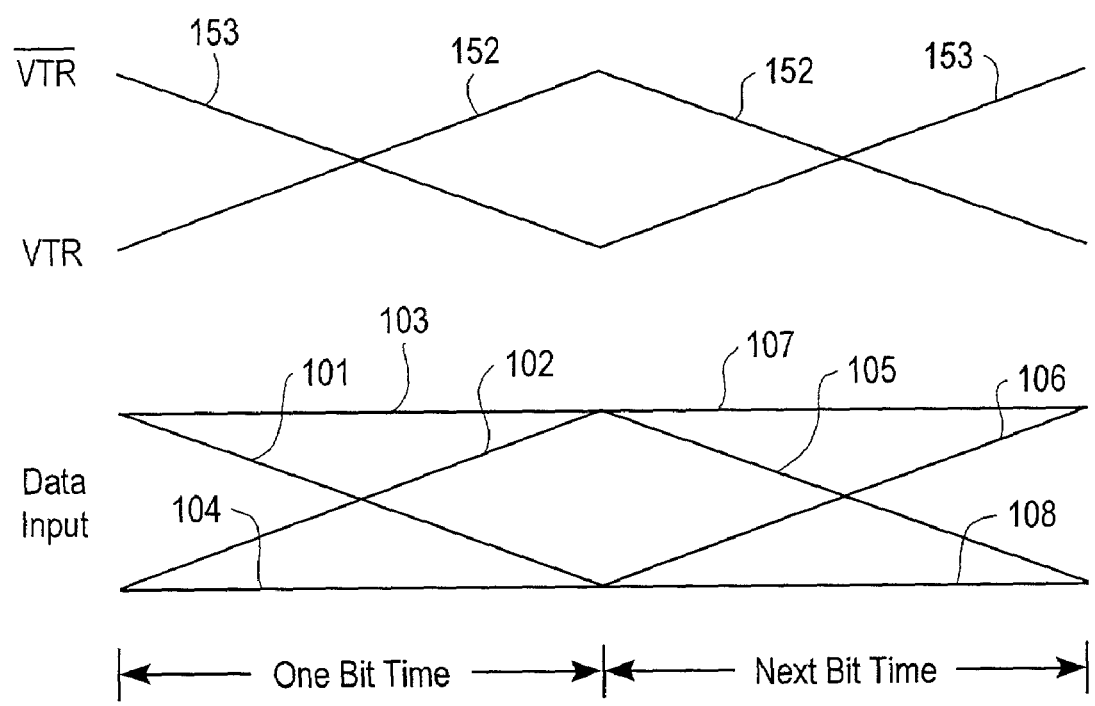
FIG. 1B shows example waveforms illustrating a comparator selection process in accordance with an embodiment of the present invention.

The operation of steering logic 160 is now further described with reference to the example timing diagram of FIG. 1B. In FIG. 1B, waveform 101 represents a data input signal that is transitioning from a HIGH state to a LOW state or "HIGH" to "LOW", waveform 106 represents a data input signal that is transitioning from LOW to HIGH, waveform 103 represents a data input signal that does not transition and remains at HIGH, waveform 104 represents a data input signal that does not transition and remains at LOW, etc. In the case of waveforms 101 and 106, steering logic 160 selects comparator 171 because the state of VTR signal 152 is opposite to that of waveforms 101 and 106 (the data input signal), thus providing a full differential signal to the inputs of comparator 171. For the same reason, steering logic 160 selects comparator 172 in the case of waveforms 102 and 105. In the case where the data input signal does not toggle, as in waveforms 103, 104, 107, and 108, steering logic 160 first deselects the previously selected comparator, then selects the other comparator. (Note that the ramp signal of FIG. 1B is used merely for convenience, and any suitable continuously or discontinuously time-varying signal can also be used.)

Referring again to FIG. 1A, steering logic 160 selects and deselects comparators by using exclusive-OR (XOR) gates 161 and 162 to control a ganged switch 164. Switch 164 couples to output node 165 either the output of comparator 171 or comparator 172. XOR gate 161 takes in data output signal 163 (via output node 165) and steering logic ("SL") signal 154 as inputs. As shown in FIG. 1A, SL signal 154 is essentially a delayed and amplified version of VTR signal 152; this allows VTR signal 152 to be exclusive-ORed with data output signal 163 using XOR gate 161. Similarly, XOR gate 162 performs an exclusive-OR operation on /SL signal 155, which is a delayed and amplified version of /VTR signal 153, and data input signal 151. Note that because VTR signal 152 and /VTR signal 153 are complementary, only one of XOR gates 161 and 162 will be in control of switch 164 at any given time. XOR gate 161 causes the output of comparator 171 to be coupled to output node 165 when VTR signal 152 and data input signal 151 have opposite states. When /VTR signal 153 and data input signal 151 have opposite states, XOR gate 162 causes the output of comparator 172 to be coupled to output node 165.

Figure 2:
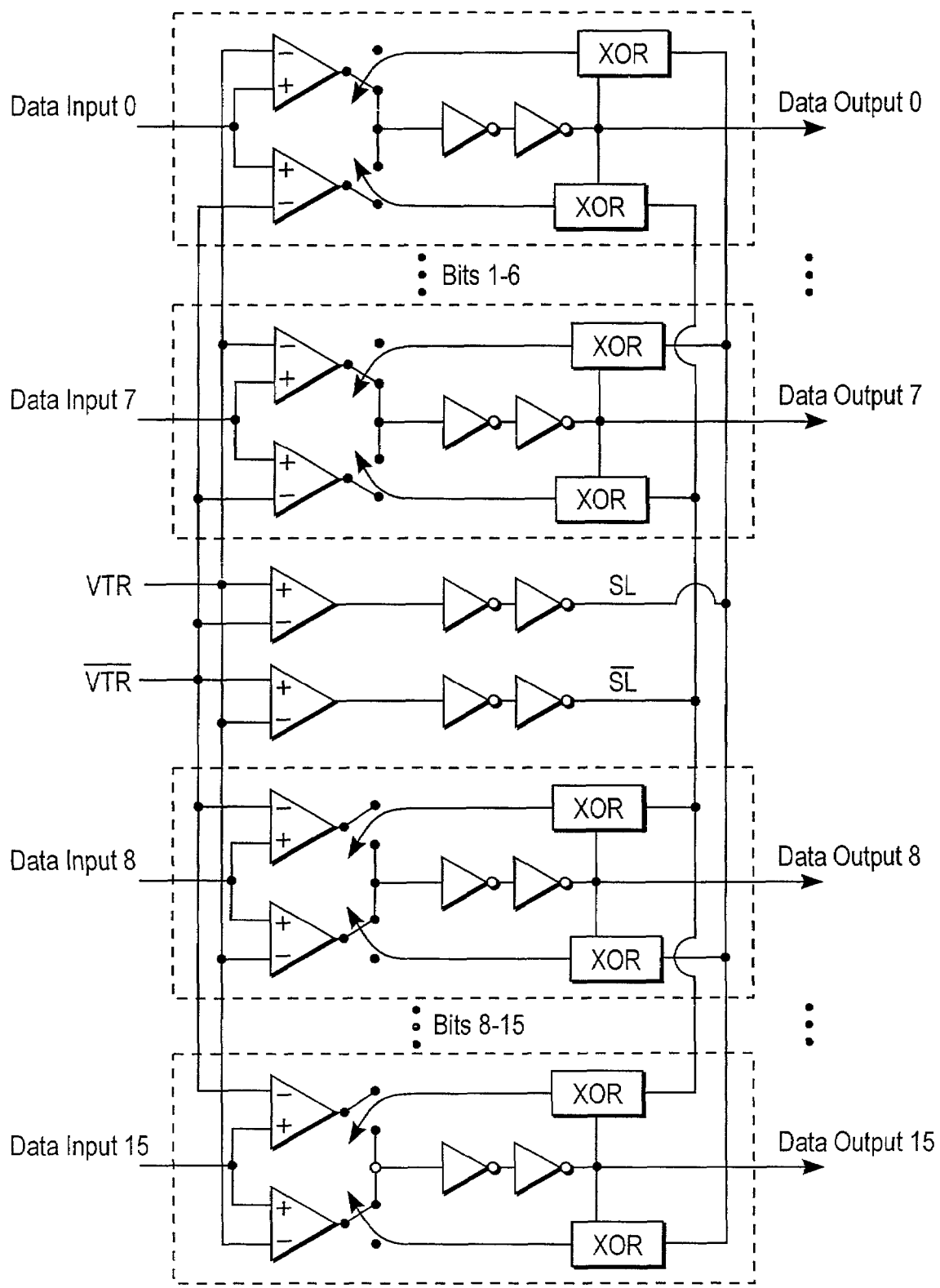
FIG. 2 shows multiple receivers in accordance with an embodiment of the present invention.

The schematic diagram of FIG. 2 illustrates an example of how the Jazio signal-switching technology can be extended to multiple channels. In FIG. 2, a single pair of complementary VTR signals (i.e., VTR and /VTR) is utilized for every sixteen data input signals. As can be appreciated, this allows for differential sensing but only requires one channel per data signal. Among other advantages, this minimizes the pin count of integrated circuits. Of course, the number of channels supported by a single VTR signal pair can vary greatly in accordance with the requirements of a particular application.

Figure 3:
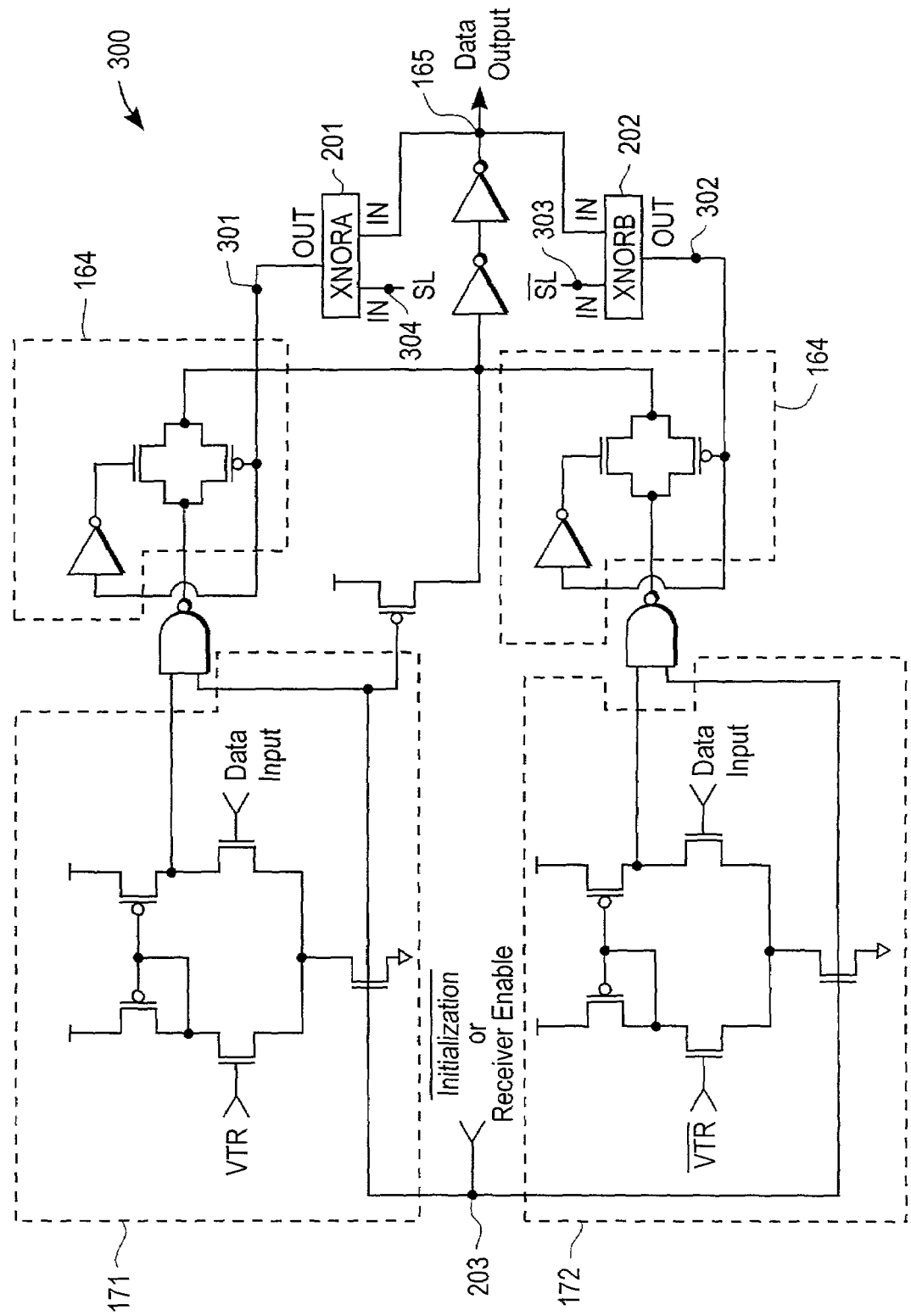
FIG. 3 shows a transistor level diagram of a receiver in accordance with an embodiment of the present invention.

FIG. 3 shows a transistor level diagram of a Jazio receiver 300 in accordance with an embodiment of the present invention. Receiver 300 is similar to receiver 100 except that exclusive-NOR (XNOR) gates 201 and 201 are used instead of XOR gates 161 and 162, respectively. The function of comparator 171, comparator 172, and switch 164 is the same in both receiver 100 and receiver 300. Receiver 300 includes a node 203 for initialization. Applying a LOW on node 203 forces a HIGH on output node 165, and disables comparators 171 and 172. As can be appreciated, node 203 can also be used to enable/disable receiver 300. In receiver 300, comparators 171 and 172 are implemented using N-type differential amplifiers with very low gain to reduce receiver offset and receiver power. Also, in receiver 300, switch 164 is a simple transmission gate controlled by an XNOR gate.

Figure 4:
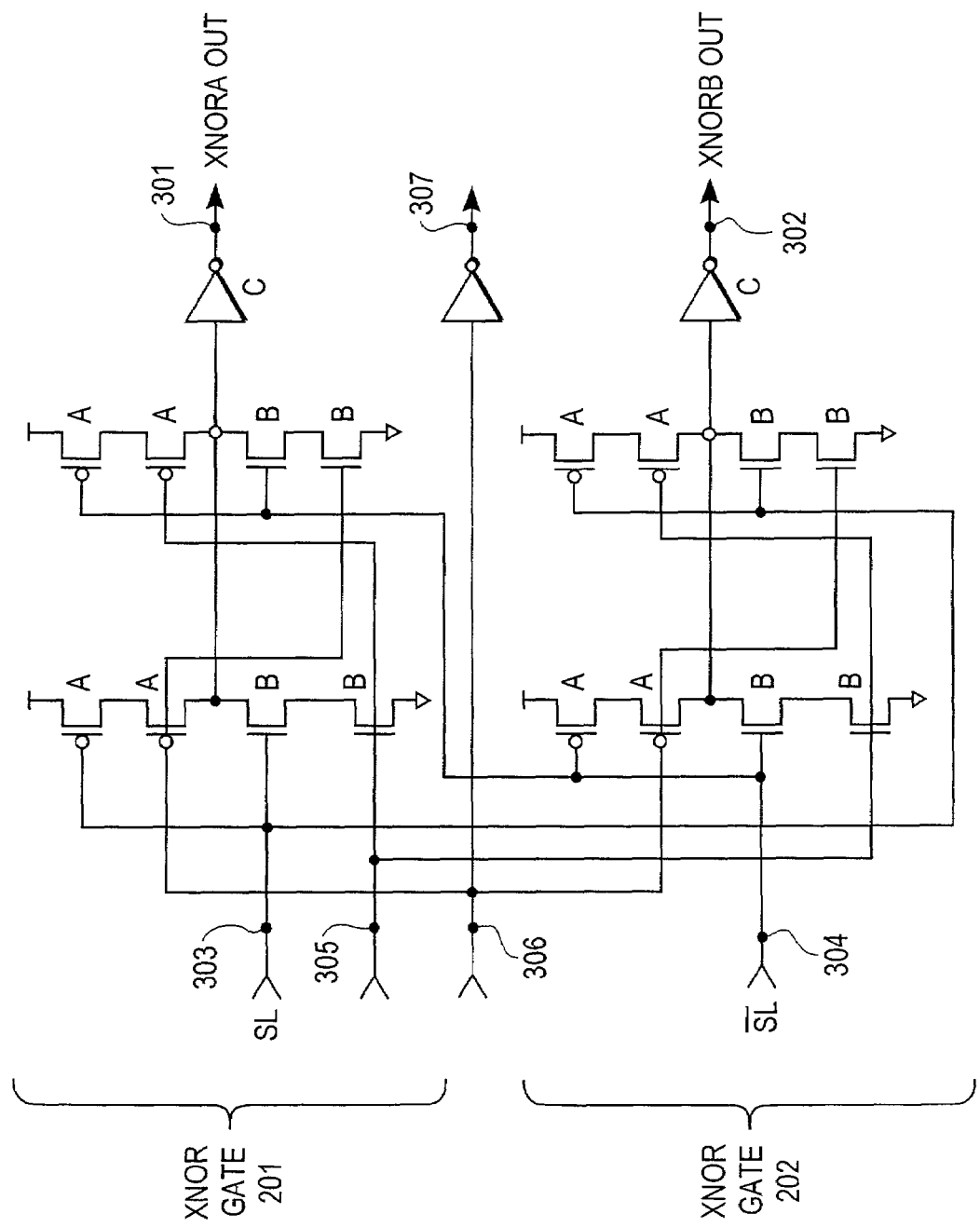
FIG. 4 shows a transistor level diagram of an exclusive-NOR gate in accordance with an embodiment of the present invention.

FIG. 4 shows a transistor level diagram of an XNOR gate in accordance with an embodiment of the present invention.

The XNOR gate of FIG. 4 includes both XNOR gates 201 and 202. Referring to FIG. 4, nodes 301 and 302 correspond to the output nodes of XNOR gates 201 and 202 respectively (see FIG. 3). Node 303 takes a VTR signal as an input to XNOR gate 201, while node 304 takes a /VTR signal as an input to XNOR gate 202. In FIG. 4, transistor sizes "A", "B", and "C" are selected to allow the XNOR outputs to go to HIGH quickly in order to break the connection from the previously selected comparator before making the connection to the other comparator (break-before-make). The transistor sizes are also chosen such that the just selected XNOR gate slowly makes the connection for the just selected comparator. This increases the skew band (further discussed below) around the VTR signals.

In contrast to conventional differential signaling schemes, the decision binary in Jazio occurs in the time domain rather than voltage domain. That means, Jazio interprets a change in the data input signal as one binary level, and a no-change in the data input signal as another binary level. FIGS. 5A and 5B further illustrate this change/no-change concept. Referring to FIG. 5A, comparator 171 (see FIG. 1A) provides a full differential output at time 501 and is thus selected. Also at time 501, the data input signal is higher than the VTR signal. At a later time 502, the difference between the data input signal and the VTR signal is approximately zero. At a further later time 503, the input signal has become lower than the VTR signal. The Jazio steering logic detects the transitions at time 501, time 502, and time 503 to determine that the data input signal has changed (i.e., toggled). As can be appreciated, the just mentioned transitions are well defined, deterministic, and fast in current Complementary Metal Oxide Semiconductor (CMOS) technology. Because the data input signal has changed, the steering logic keeps comparator 171, which is the comparator for the data input signal and the VTR signal, selected.

FIG. 5B illustrates a case where the data input signal does not change. Referring to FIG. 5B, comparator 171 (see FIG. 1A) provides a full differential output at time 511 and is thus selected. Also at time 511, the data input signal is higher than the VTR signal. Because the data input signal has not changed, the difference between the data input signal and the VTR signal will be approximately zero at a later time 512. The time between time 501 and time 502 in the case where the data input signal has changed (FIG. 5A) is shorter than that separating time 511 and time 512 in the case where the data input signal has not changed (FIG. 5B). The steering logic detects the longer time separation, and that the output of the currently selected comparator remains at zero for a period of time after time 512, to determine that the data input signal has not changed. Accordingly, the steering logic deselects the currently selected comparator, and then selects the other comparator.

Figure 5C:
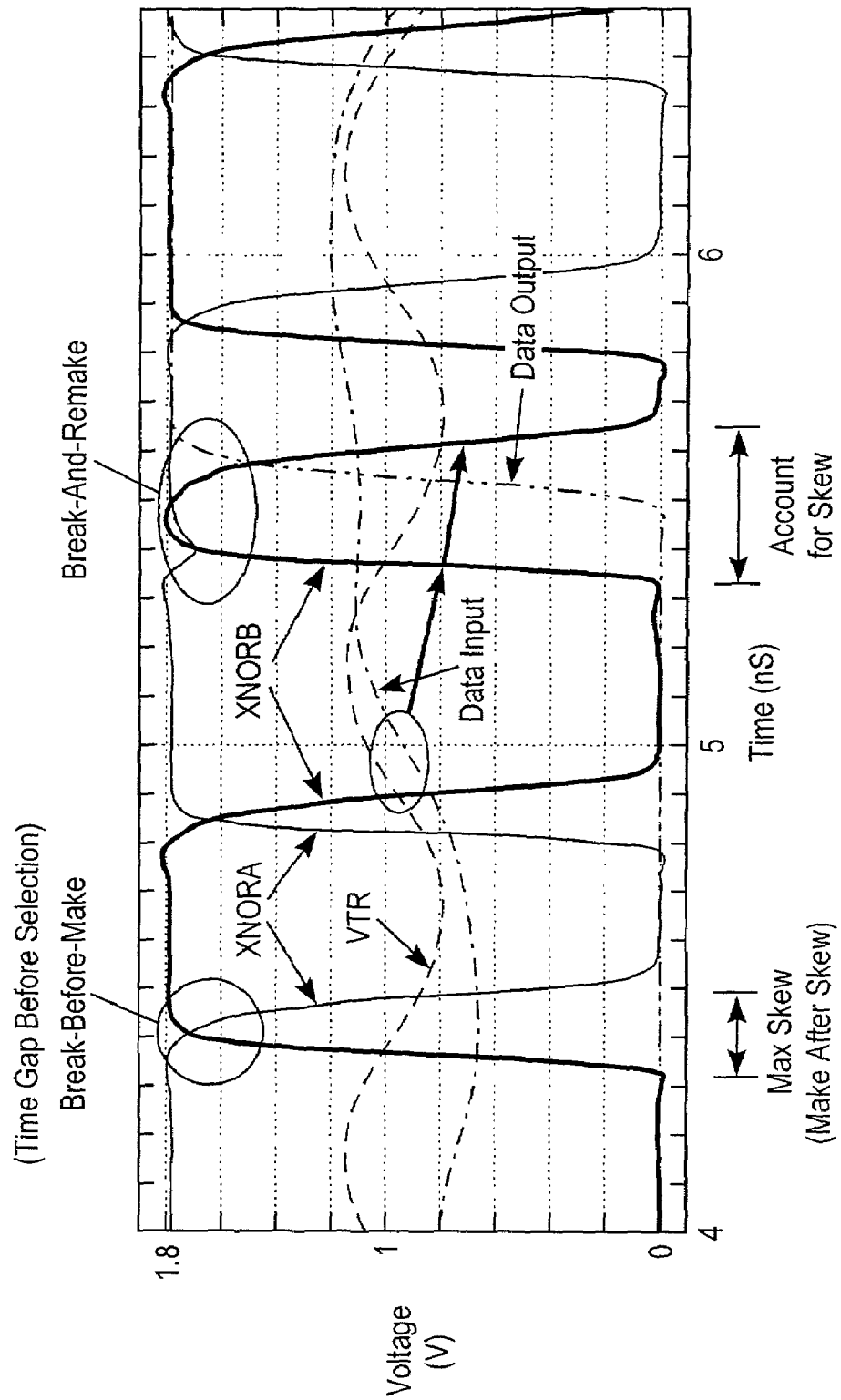
FIG. 5C shows a waveform illustrating a change/no-change concept of the present invention in conjunction with a skew band, and wherein the XOR gates of FIG. 1A have further been replaced with XNOR gates, in accordance with an embodiment of the invention.

The FIG. 5C waveform illustrates an embodiment of the change/no-change concept in conjunction with a skew band, and wherein the XOR gates of FIG. 1A have further been replaced with XNOR gates.

Figure 6:
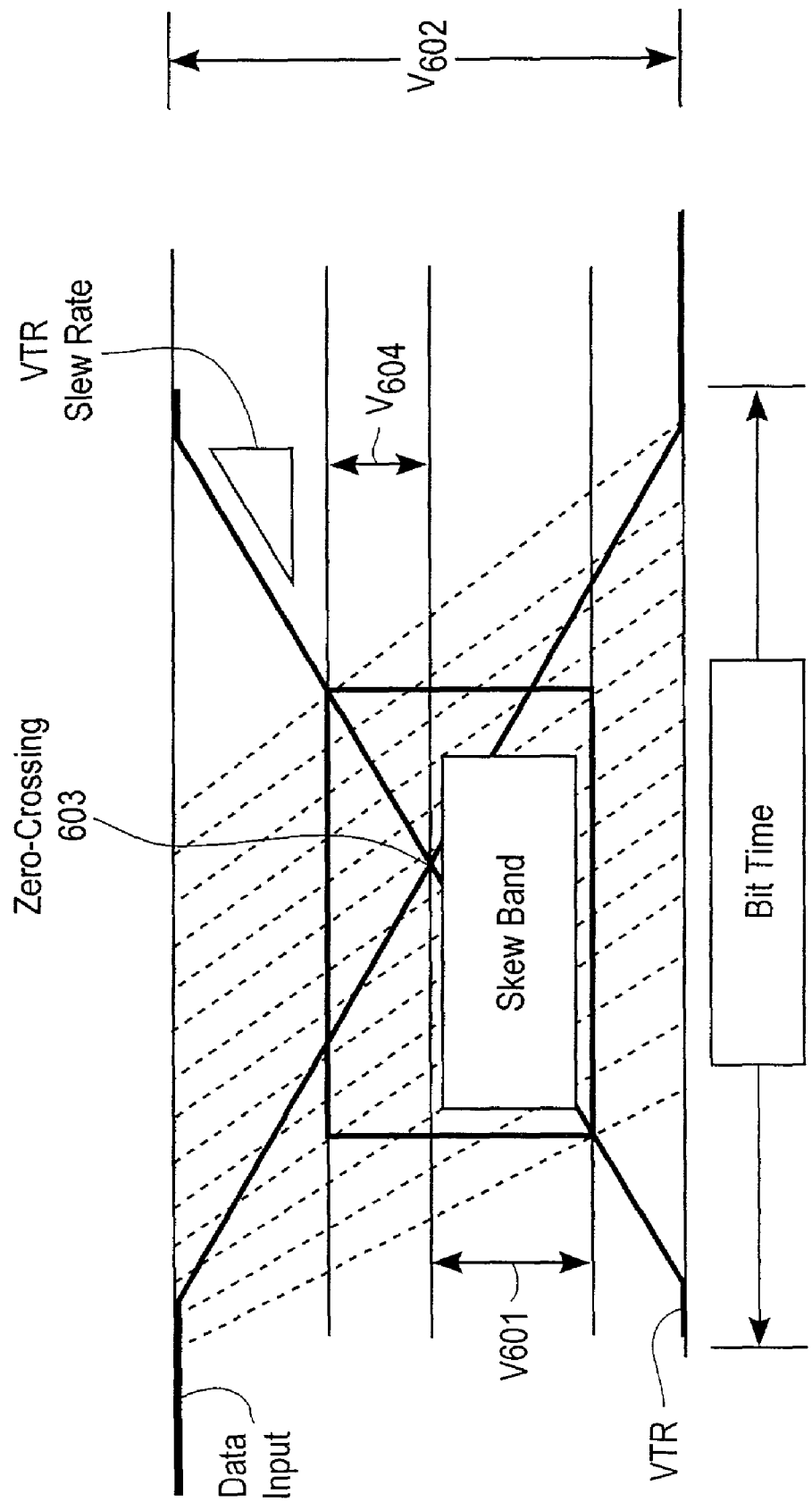
FIG. 6 shows example waveforms illustrating a skew band in accordance with an embodiment of the present invention.

The effect of skew in a Jazio type transmitter/receiver is now discussed with reference to FIG. 6, which shows an example timing relationship between a data input signal and a VTR signal (the complementary /VTR signal is not shown for clarity of illustration). The amount of time a data input signal can be skewed without inducing transmission errors is limited by the amount of time allocated for transmitting a single bit or "bit time." In one specific application that has a full differential signal of less than or equal to 500 mV and where the slew rate of the VTR signal is 1.25 V/ns (volt per nanosecond), the skew band has been found to be around 40% of the bit time. That is, the data input signal can be moved in time within a window having a width equal to 40% of the time that it takes to transmit one bit of data. In that application, the skew band extends 150 mV below (voltage $V_{601}$) and 100 mV above (voltage $V_{604}$) the point where the difference between the data input signal and the VTR signal is zero (zero-crossing 603).

Improvements in device fabrication technology and increased demand for higher data transfer speeds push the bit times lower. Because skew band is affected by bit time, as mentioned above, a lower bit time results in a narrower skew band. Thus, higher data transfer speeds require better control of skew. In another aspect of the present invention, an improved technique for deskewing data input signals is employed to increase data transfer speeds. Such a deskewing technique is now described beginning with FIG. 7A.

Figure 7A:
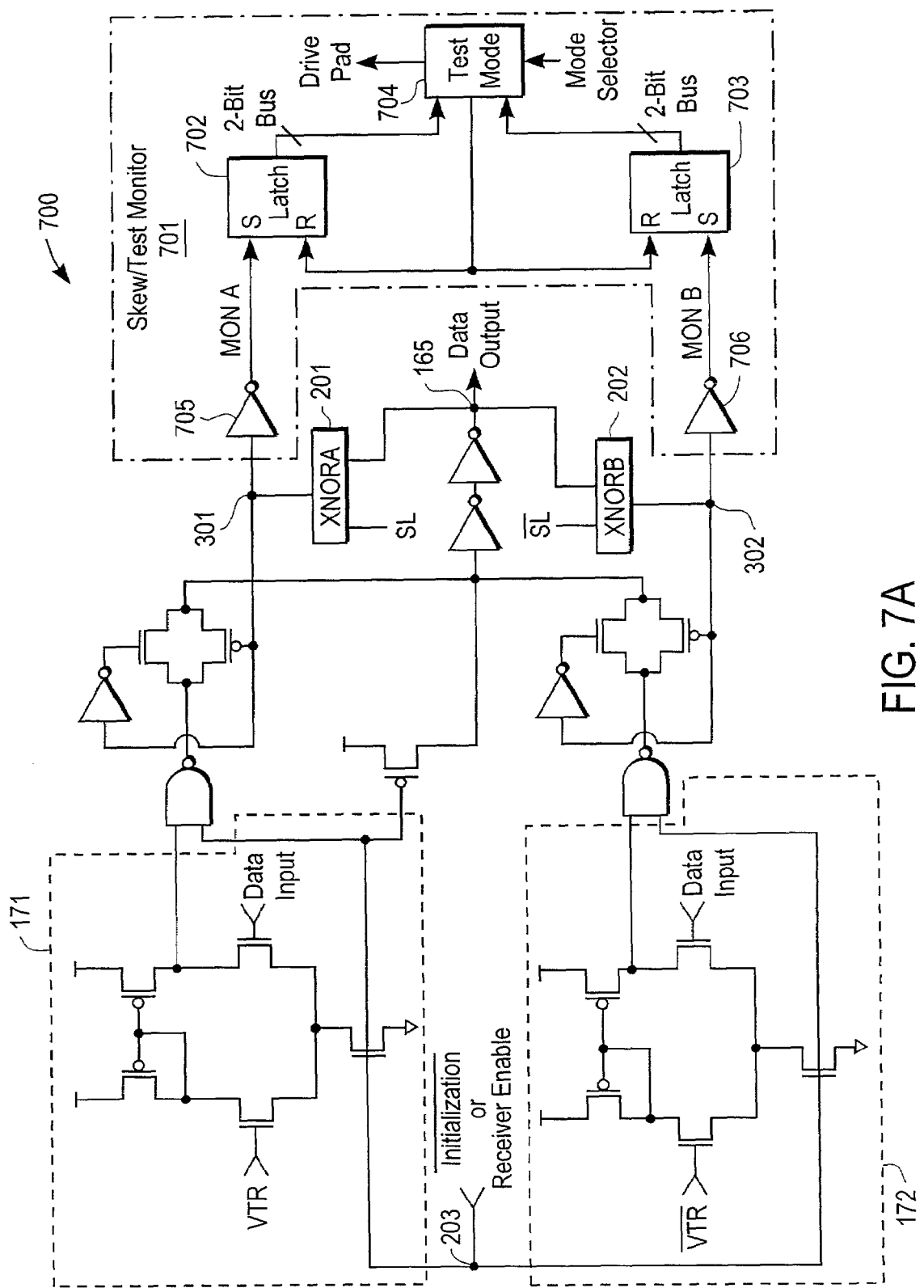
FIG. 7A shows a schematic diagram of a receiver in accordance with an embodiment of the present invention.

FIG. 7A shows a schematic diagram of a Jazio receiver 700 in accordance with an embodiment of the present invention. Except for the addition of a test monitor 701 in receiver 700, receiver 700 is otherwise the same as receiver 300 shown in FIG. 3. Thus, receiver 700 processes a received data input signal in the same manner as receiver 300.

Broadly stated, test monitor 701 provides an example of how the change/no-change and other characteristics of the Jazio technology can be exploited in order to provide for skew detection, as in the present example, as well as for skew correction (examples of which are provided below). Using the Jazio technology, skew need not be detected in accordance with data signal level measurements, durational measurements or complex test patterns and analysis, as in the prior art.

Rather, skewing is detectable during even the normal operation of a Jazio receiver as an occurrence of a time-shifted data signal change with respect to VTR signal change, the occurrence of which, e.g. using an XOR or XNOR gate in this case as a comparator, appears as a glitch (see below). The occurrence of one or more glitches or "glitch events" is thus detectable using a latch and/or other suitable glitch detector or "skew monitor" circuitry/software. It will therefore be apparent that suitable circuitry/software can also be used to determine increasing/decreasing numbers of glitch events, to count glitch events, and so on, for example, while tuning a VTR pair or receiver to reduce or minimize such occurrences, switching VTR pairs or other circuitry and so forth, in order to accomplish skewing correcting or "de-skewing" (or otherwise for testing or other purposes). Thus, while specific detection and correction embodiments are provided herein, it will appreciated that other mechanisms can also be used, and further that the invention is also applicable to other than Jazio technology, as well as combinations of Jazio and other technologies, whether or not indicators of such other mechanisms/technologies are glitches.

Returning now to the FIG. 7A example, the portion of test monitor 701 coupled to XNOR gate 201, which is also referred to as "MONA", includes latch 702. The output of XNOR gate 201 is indicative of the alignment between the data input signal and the VTR signal. If the data input signal and the VTR signal are properly aligned, they would complement each other and thus would be in opposite states. Because XNOR gate 201 performs an exclusive-NOR operation between the data input signal (as it appears on output node 165) and the VTR signal (in the form of SL signal, which is a delayed and amplified version of the VTR signal), the opposite states of the aforementioned signals result in XNOR gate 301 outputting a LOW on node 301.

The LOW on node 301 is inverted to a HIGH by inverter gate 705, which then sets latch 702 to output a HIGH indicating that the data input signal and the VTR signal are aligned.

If the data input signal and the VTR signal are not aligned, the two signals would be in the same state, thereby causing XNOR gate 201 to output a HIGH on node 301. The HIGH on node 301 is inverted to a LOW by inverter gate 705, which then presents a LOW on the set input of latch 702, indicating a glitch.

The portion of test monitor 701 coupled to XNOR gate 202, which is also referred to as "MONB", includes latch 703. The output of XNOR gate 202 is indicative of the alignment between the data input signal and the /VTR signal. The output of XNOR gate 202 is provided to latch 703 via inverter gate 706. Analogous to latch 702, latch 703 latches glitches that occur when the data input signal and the /VTR are not aligned. (High or Low directed glitches can be similarly indicated.)

The 2-bit buses coupled to latches 702 and 703, and to test mode 704 provide an example of how greater flexibility or ease of use can be provided via suitable output and/or processing. For example, one or both of such buses can be used to provide complementary outputs. Alternatively, a first channel of each bus can be used to indicate that that the alignment between the data input signal and the /VTR signal is marginal and requires adjustment or "tuning", while a second channel of each bus indicates whether the alignment is becoming more or less marginal during such circuit tuning (e.g., where receiver tuning is being conducted by a user to whom an indicator of channel data is being presented or automatically via circuitry/software utilizing such indicators). It will be appreciated that other couplings and/or various tuning circuitry/software can also be used in accordance with a particular application.

Similarly, while the mode selector signal input (to Test Mode 704 ) can include a one bit test mode selector for selecting different test modes, e.g. in addition to a test mode enable (MEN) or other signal which might also be included for enabling and disabling a test mode, various other signals and/or features might be used in accordance with a particular application. Also similarly, the drive pad output of test mode 704 can include one or more signals (e.g. marginal and more or less marginal, specific data, control information, etc.) for output to an external pin, circuit, and so on, in accordance with a particular application. Finally, the signal from Test Mode 704 to signal "R" of latches 702, 703 provides for resetting the latches, for example, before, during or after execution of a test mode operation, after a test mode preamble, and so on, in accordance with a particular application.

Figure 7B:
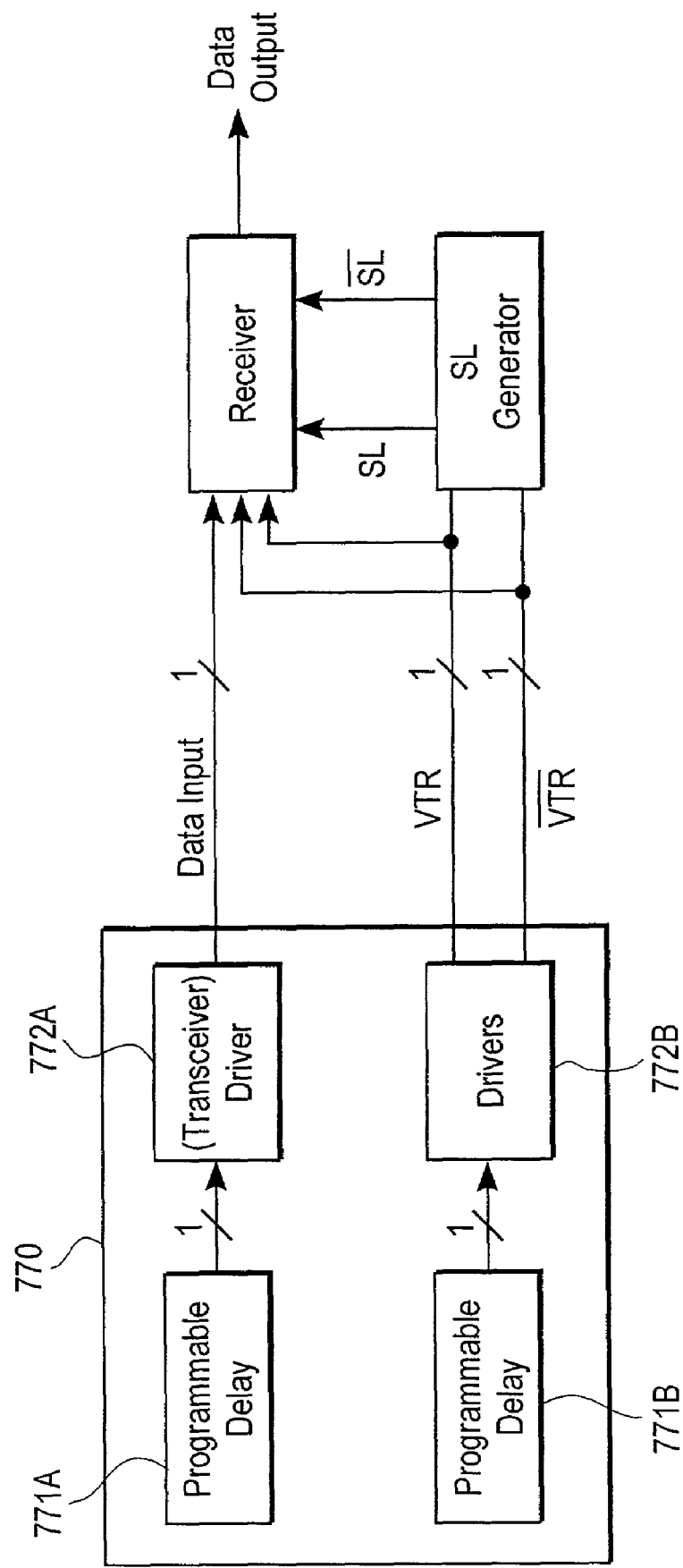
FIG. 7B shows a schematic diagram of a transmitter group with programmable delay circuits in accordance with an embodiment of the present invention.

As can be appreciated, the optimum amount of delay for each channel can be determined by varying the skew of the data input signals and the VTR signal pair and then testing for alignment. The amount of delay that results in the best alignment can then be programmed into a programmable delay circuit coupled to each channel. FIG. 7B shows a schematic diagram of a Jazio transmitter 770 with such programmable delay circuits in accordance with an embodiment of the present invention. In transmitter 770, each channel includes a programmable delay circuit 771 (i.e., 771A, 771B) coupled to a driver circuit 772 (i.e., 772A, 772B). By programming the respective delay circuits with the optimum amount of delay, the resulting output signals of the driver circuits will have the right amount of skew to maintain proper alignment. Of course, depending on the application, other ways of changing the skew can also be used. For example, fixed delay lines, are also suitable for skew adjustment in accordance with the present invention.

Figure 8A:
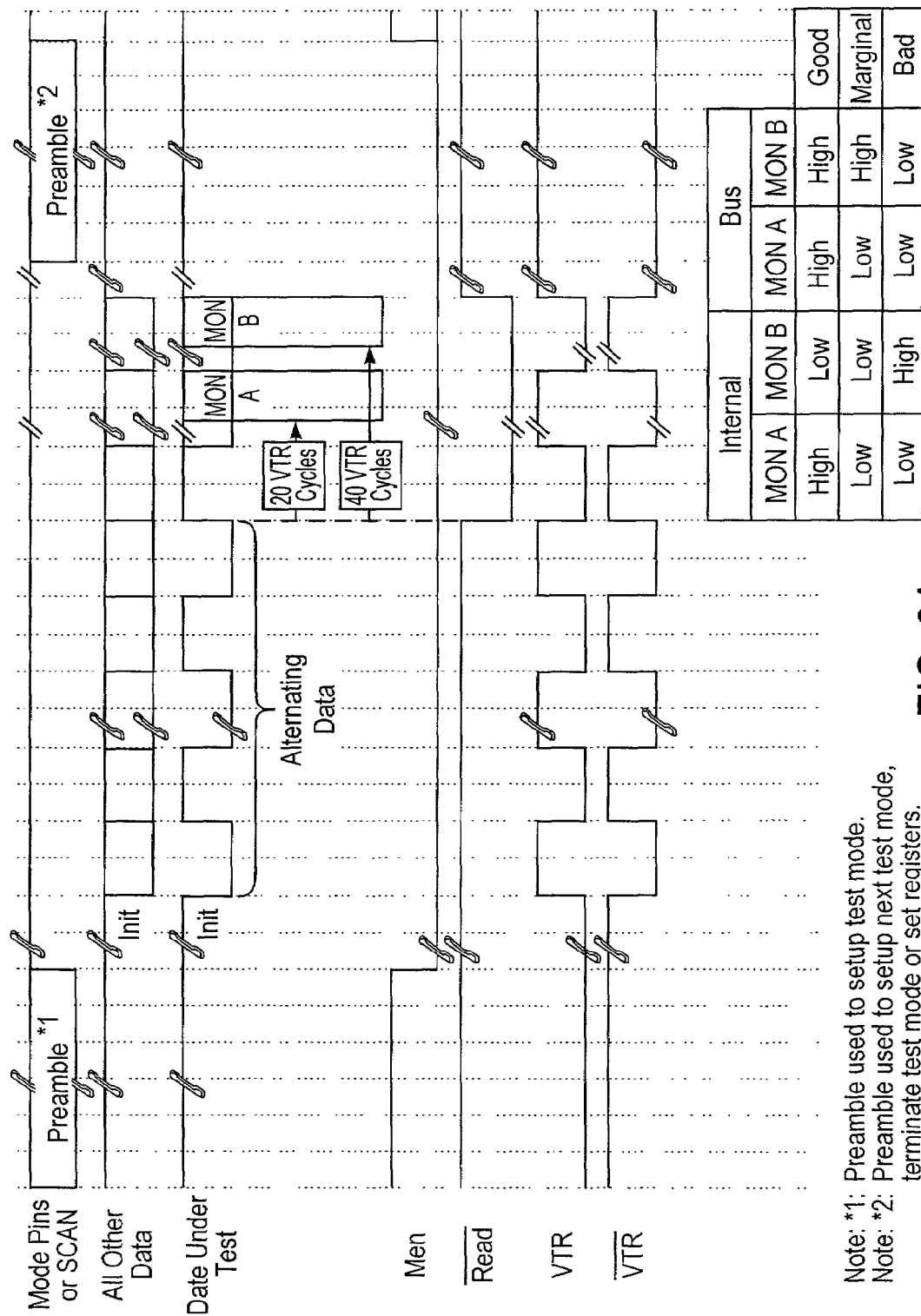
FIGS. 8A and 8B show waveforms illustrating alignment testing in accordance with an embodiment of the present invention.

FIG. 8A illustrates an exemplary timing diagram for implementing a test mode, such as the test mode of FIG. 7A, or another suitable test mode. As shown in FIG. 8A, a test mode preamble including test mode information (e.g. to initiate the test mode signals discussed with reference to FIG. 7A, and or other suitable information) to begin a particular test mode is provided via the transmitter prior to beginning an initial test or further tests. Following the preamble, test data including alternating data (i.e. including data level changes from LOW to HIGH and/or HIGH to LOW) is also sent to the receiver or receivers being tested along with VTR signals and assertion of a test mode enable or "Men" signal, and a /read signal is asserted. (Other data can also be sent, e.g., to one or more other receivers.) Finally, assuming that further testing is to be conducted, a further preamble may be transmitted (again, without VTR signals) to similarly setup the additional testing. Of course, the timing and other specific protocols of FIG. 8A are merely exemplary, and may well vary in accordance with a particular application.

Figure 8B:
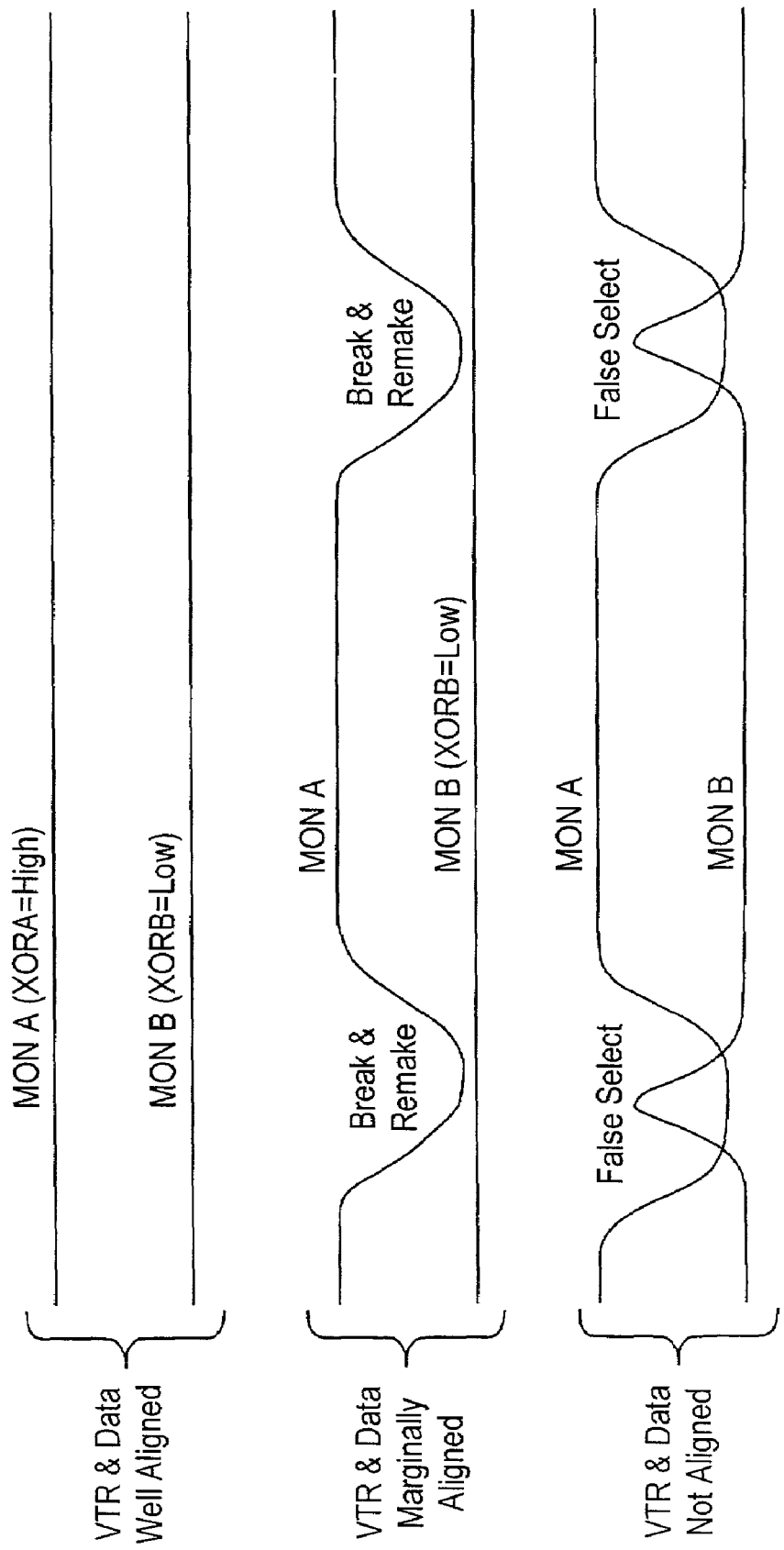

The chart included with FIG. 8A indicates an example of three data-VTR alignment conditions (good, marginal and bad alignment in this example) indicated by the concurrent states of the XOR or XNOR gates of a receiver with regard to "internal" test mode implementation, and further, for outputting onto the "bus" (as also indicated by signals MON-A and MON-B of FIG. 7A. FIG. 8B illustrates in greater detail the internal XOR or XNOR gate (and MON-A and MON-B) signals associated with the three alignment conditions. As shown, the VTR signals are well-aligned where the XOR-A/MON-A are high and XOR/MON-B are low, are marginally aligned as depicted and are not aligned where one or more false selects occur. Of course, particular "levels" of alignment utilized can vary in accordance with a particular application.

Note that it is possible for skew to be so severe that, at high frequencies, the skew will exceed on bit and will not be detected. Therefore, it is prudent to first conduct testing and make at least coarse adjustments at a low frequency. Thereafter, it can be assured that any skew does not exceed one bit and testing/tuning can be conducted at varying frequencies.

In another aspect of the present invention, two pairs of complementary VTR signals are employed to further widen the skew band. This aspect of the present invention, referred to herein as "Dual VTR Pair" technique, is advantageous in applications where the skew is greater than 40% of the bit time or the skew does not scale with the increased data transfer speed. In the Dual VTR Pair technique, one pair of complementary VTR signals is offset in time relative to another pair. This is further explained with reference to the example timing diagram of FIG. 9.

Figure 9:
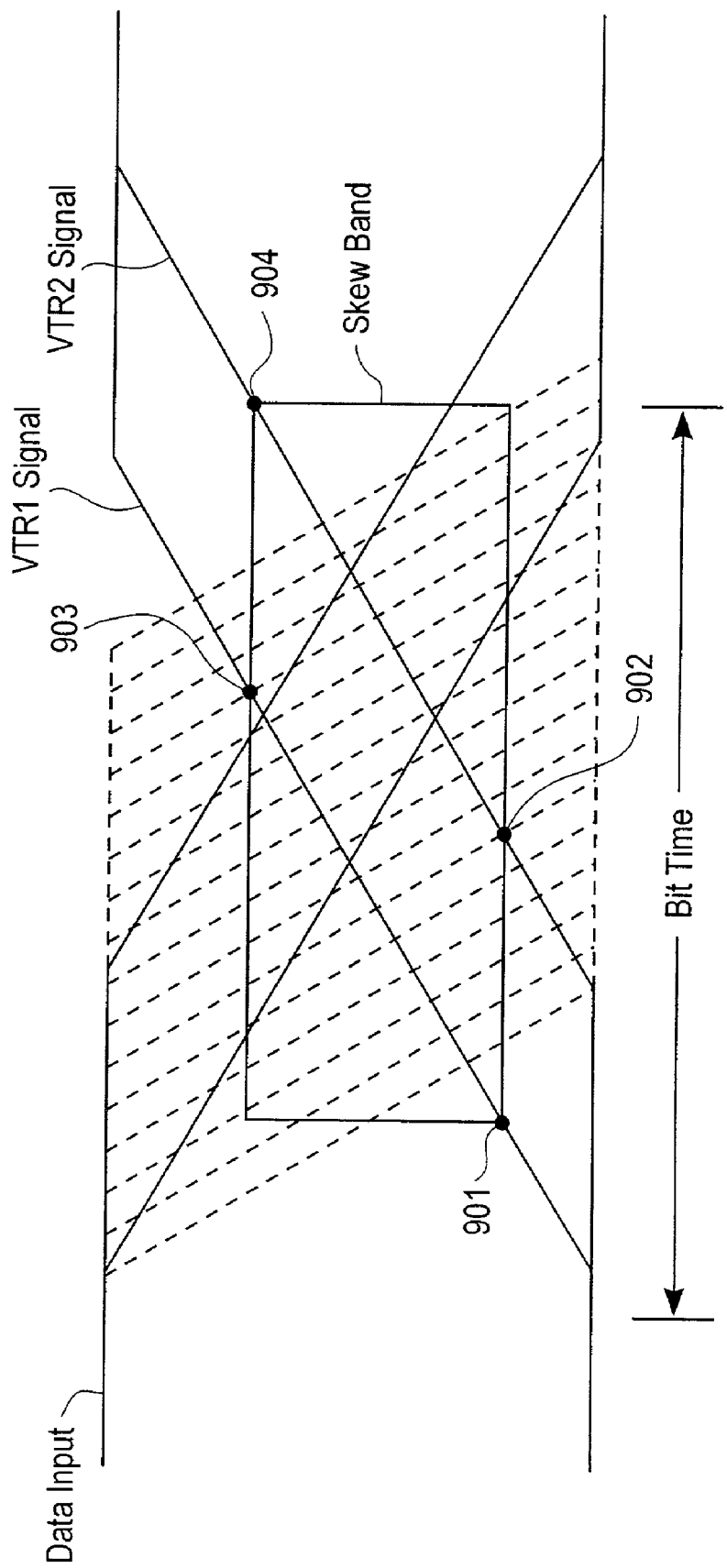
FIG. 9 shows waveforms illustrating a skew band in accordance with an embodiment of the present invention.

Referring to FIG. 9, a VTR1 signal belongs to a first pair of VTR signals, while a VTR2 signal belongs to a second pair of VTR signals. The corresponding complementary signals, /VTR1 and /VTR2 , are not shown for clarity of illustration. By using two offset pairs of complementary VTR signals and by selecting one of the pairs for comparison with the data input signal, the resulting skew band is effectively widened. That is, the option to use either the VTR1 signal or the VTR2 signal, whichever is more aligned with the data input signal, allows the data input signal to be skewed within a wider window of time. For example, choosing the VTR1 signal allows the data input signal to be skewed between points 901 and 903. Likewise, choosing the VTR2 signal allows the data input signal to be skewed between points 902 and 904. Thus, in effect, the skew band for the data input signal is from point 901 to point 904 using the Dual VTR Pair technique.

Figure 10:
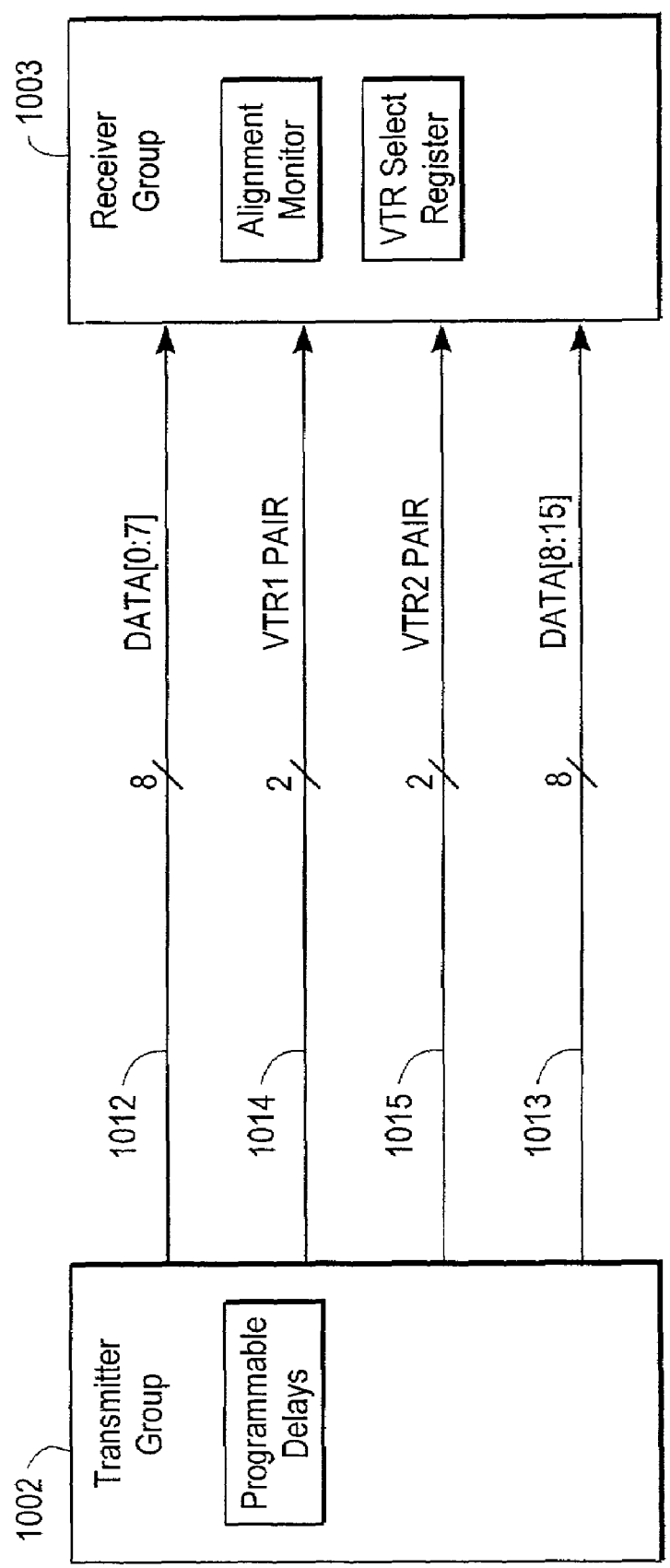
FIG. 10 shows a schematic diagram of a bus in accordance with an embodiment of the present invention.

FIG. 10 shows a schematic diagram of a bus incorporating the Dual VTR Pair technique in accordance with an embodiment of the present invention. In the example of FIG. 10, transmitter group 1002 transmits 8 data input signals (data bits 0 to 7) on channels 1012 and another 8 data input signals (data bits 8 to 15) on channels 1013. Transmitter group 1002 also transmits a first VTR signal pair (VTR1 and /VTR1) on channels 1014, and a second VTR signal pair (VTR2 and /VTR2) on channels 1015. Transmitter group 1002 includes driver circuitry (not shown) for each of the channels. A programmable delay circuit coupled to each driver circuit generates enough delay such that a data input signal is properly aligned with at least one of the VTR signal pairs. The amount of delay is determined by an alignment monitor in receiver group 1003, and provided to transmitter group 1002.

As was already discussed, alignment can, for example, be categorized according to well aligned, marginally aligned or not aligned/poorly aligned (e.g. see FIGS. 7A, 8A and 8B). Alignment can also be indicated according to alignment changes, such as better or worse, for example, to facilitate alignment tuning. (Other suitable indicators can, of course be used or some combination of these and other indicators can be used.). Alignment indicators, such as status flags or other suitable indicators can, for example, be provided to the transmitter for tuning the transmitter to provide improved alignment (e.g. using a bidirectional data input, a data input for which bi-directional transmission is enabled during testing and/or using separate coupling). Such indicators can also be received by a transmitter register, flag, driver, or other suitable mechanism. (It will be appreciated, however, the conditions and protocols can again be conducted in accordance with requirements of a particular application.)

In one embodiment, the alignment monitor of receiver group 1003 includes a test monitor 701 shown in FIG. 7A for determining the amount of delay necessary for proper alignment. Each data input signal has a corresponding VTR select register in receiver group 1003 for selecting the VTR signal pair best aligned with it.

Figure 11:
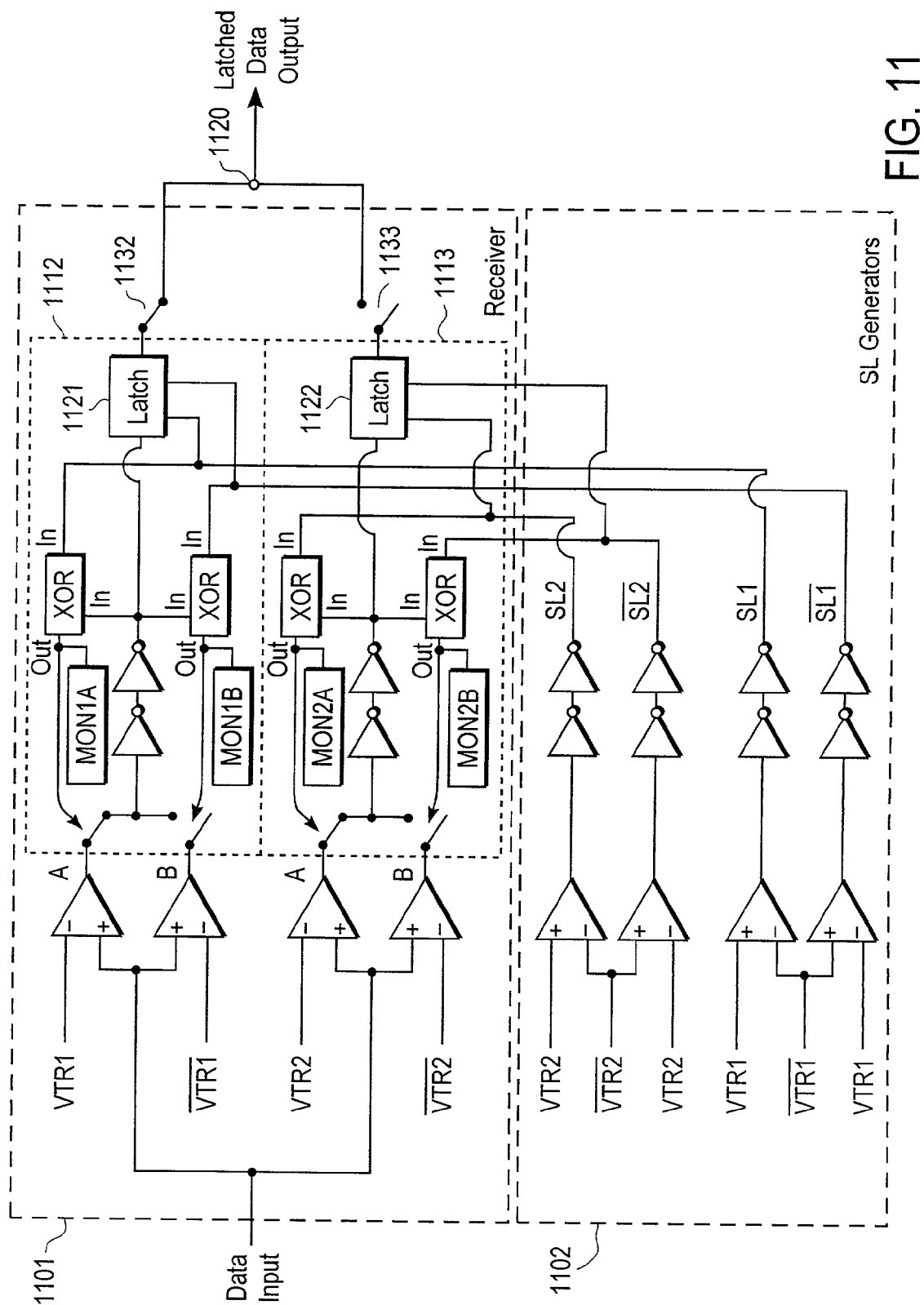
FIG. 11 shows a schematic diagram of a receiver in accordance with an embodiment of the present invention.

FIG. 11 shows a schematic diagram of a Jazio receiver 1101 that employs a Dual VTR Pair technique in accordance with an embodiment of the present invention. Receiver 1100 receives a data input signal and two VTR signal pairs from a Jazio transmitter (not shown). The two VTR signal pairs are shared by multiple Jazio receivers to minimize pin count. Referring to FIG. 11, receiver 1101 includes a steering logic 1112 for the first VTR signal pair, and a steering logic 1113 for the second VTR signal pair. Depending on which VTR signal pair is most aligned with the data input signal, either the output of steering logic 1112 or of steering logic 1113 is latched for output to output node 1120. For example, if the VTR1 signal pair (i.e., VTR1 and /VTR1) is more aligned with the data input signal than the VTR2 signal pair (i.e., VTR2 and /VTR2), then steering logic 1112 provides the output signal to output node 1120; otherwise, steering logic 1113 provides the output signal to output node 1120.

Each steering logic in receiver 1101 includes an alignment monitor circuit to test for proper alignment. As shown in FIG. 11, steering logic 1112 includes alignment monitor circuits MON1A and MON1B for testing the alignment between the VTR1 signal pair and the data input signal. In one embodiment, monitor circuits MON1A and MON1B are part of a test and monitor circuit such as test monitor 701, previously described with reference to FIG. 7A. Similarly, steering logic 1113 includes monitor circuits MON2A and MON2B for testing the alignment between the data input signal and the VTR2 signal pair. The testing of each data input signal for alignment and the programming of the corresponding VTR select registers can be performed upon start-up to minimize impact on normal operation.

If the alignment test indicates that the VTR1 signal pair is better aligned with the data input signal than the VTR2 signal pair, then steering logic 1112 is selected to provide the output signal to output node 1120. In that case, the VTR select register for the data input signal is programmed to indicate the VTR1 signal pair. Also in that case, switch 1132 is closed and switch 1133 is opened. This results in the output of steering logic 1112 being latched in latch 1121 using a delayed version of the VTR1 signal pair (i.e., signals SL1 and /SL1 from SL generator 1102 shown in FIG. 11), and coupled to output node 1120 through switch 1132. In one embodiment, data is latched in latch 1121 using techniques similar to that described in the incorporated by reference and commonly-owned U.S. patent application Ser. No. 09/578,354, entitled "Signal Latching Of High Bandwidth DRAM Arrays When Skew Between Different Components Is Higher Than Signal Rate," filed on May 24, 2000, by Ejaz Ul Haq.

In the case where the alignment test indicates that the VTR2 signal pair is better aligned with the data input signal than the VTR1 signal pair, steering logic 1113 is selected to provide the output signal to output node 1120, in a manner analogous to that for selecting steering logic 1112. Implementation of such selection of VTR1 or VTR2 can, for example, be conducted by a testing circuit such as test mode 704 of FIG. 7A, or by another suitable mechanism in accordance with a particular application.

In one embodiment, a steering logic is deselected using the complement of the signal used to select the other steering logic. For example, if signal SETV1 is the signal used to select steering logic 1112 and close switch 1132 (see FIG. 11), then signal /SETV1 (the complement of SETV1) may be applied on the receiver enable node of steering logic 1113 to deselect it. An example receiver enable node is node 203 shown in FIGS. 3 and 7.

Figure 12:
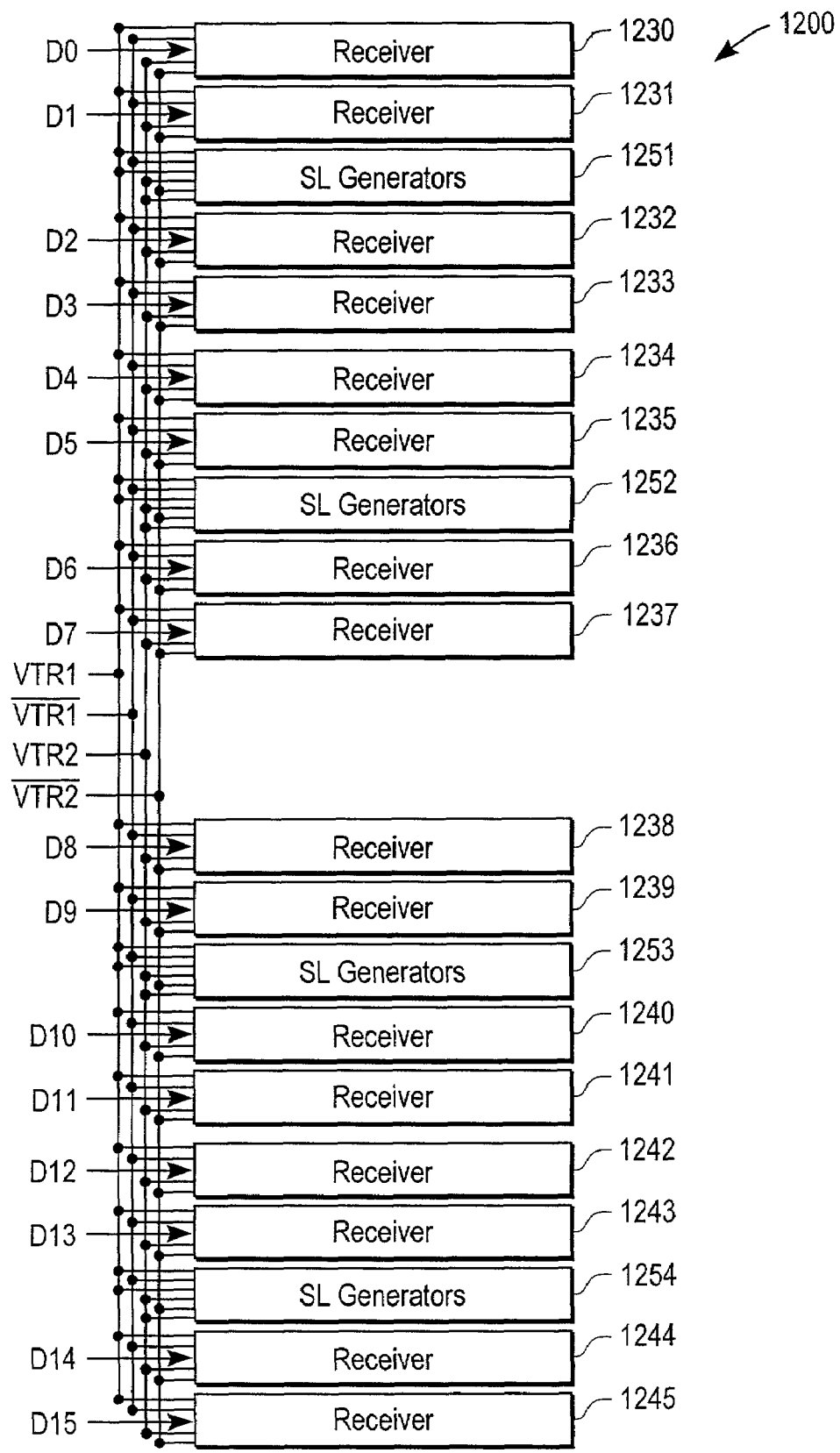
FIG. 12 shows a schematic diagram of a receiver group for receiving data input signals in parallel in accordance with an embodiment of the present invention.

FIG. 12 shows a schematic diagram of a receiver group 1200 for receiving sixteen data input signals (i.e., D0–D15) in parallel in accordance with an embodiment of the present invention. The sixteen data input signals share two VTR signal pairs, shown in FIG. 12 as VTR1-/VTR1 and VTR2-/VTR2. A delayed version of the VTR signals are provided by SL generators 1251–1254 for the XNOR (or XOR) gates and latches of receivers 1230–1245. In receiver group 1200, an SL generator is provided for every four receivers: SL generators 1251, 1252, 1253, and 1254 provide a delayed version of the two VTR signal pairs to receivers 1230–1233, 1234–1237, 1238–1241, and 1242–1253, respectively. Of course, the number of data input signals per SL generator depends on the specific application.

Figure 13:
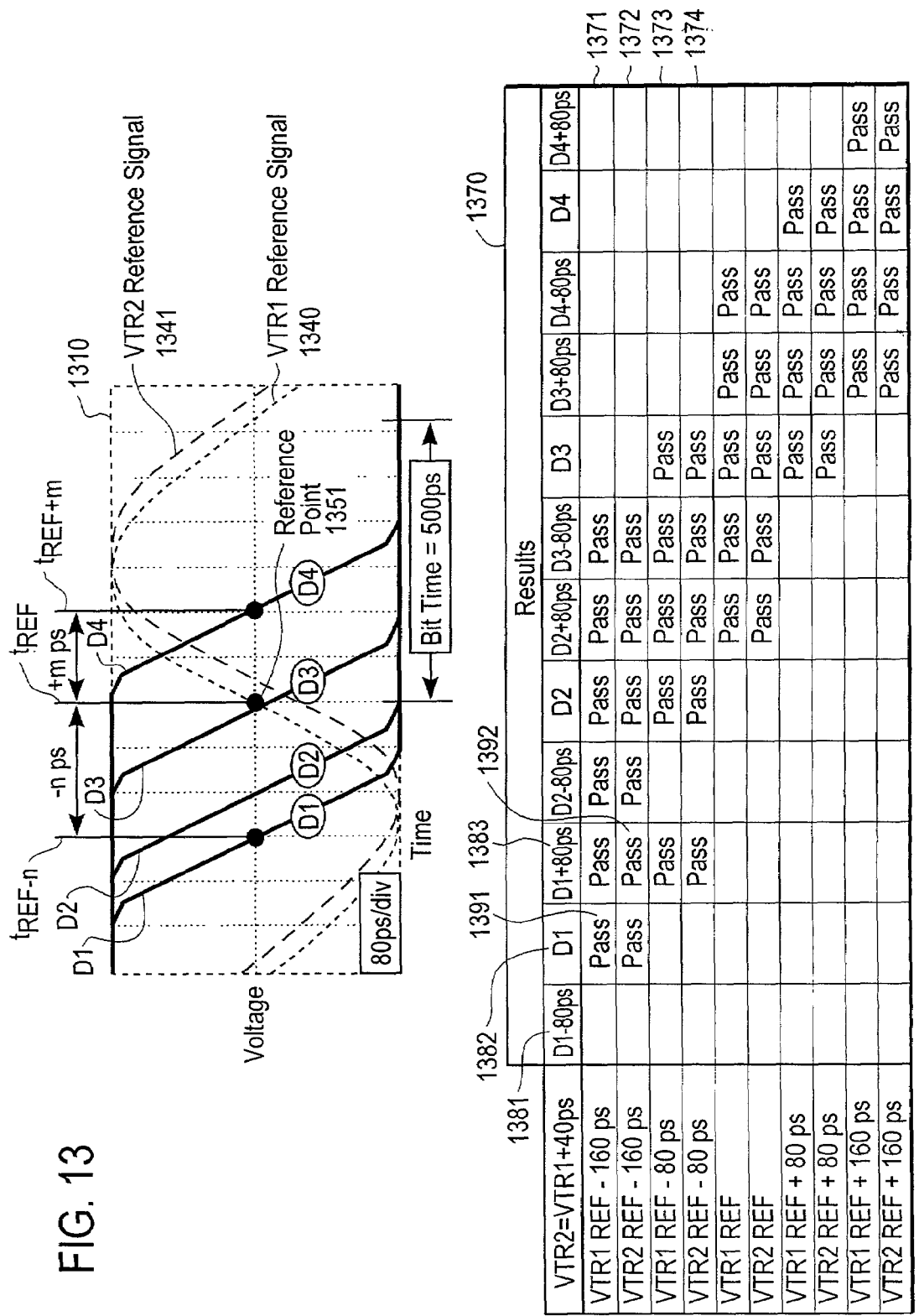
FIG. 13 shows plots and a table illustrating alignment testing in accordance with an embodiment of the present invention.

In another aspect of the present invention, the selection of the VTR signal pair is further improved by making the VTR signal pairs occur at different points in time, with the first VTR signal pair offset in time from the second VTR signal pair. This may be accomplished, for example, by using an in-line programmable delay circuit to delay a VTR signal pair such that the pair occurs at a desired point in time. By making each VTR signal pair occur at separate points in time, the alignment monitor circuits can be more effectively used to delay the individual data input signals and match each of them with the most appropriate VTR signal pair. FIG. 13 shows an example plots 1310 and associated test result table 1370, which further Illustrate this aspect of the present invention. Plots 1310 show a VTR1 reference signal 1340, a VTR2 reference signal 1341, and data input signals D1, D2, D3, and D4. Complementary VTR signals /VTR1 and /VTR2 are not shown for clarity. In plots 1310, the horizontal axis represents time and the vertical axis represents voltage. Each division on the horizontal axis equals 80 ps. Designating the point where VTR1 reference signal 1340 and data input signal D3 intersect as reference point 1351, then data input signal D1 occurs at −240 ps (i.e., minus 240 picoseconds), data input signal D2 occurs at −160 ps, data input signal D3 occurs at 0 ps, and data input signal D4 occurs at +160 ps from reference point 1351, respectively. Similarly, VTR1 reference signal 1340 occurs at 0 ps from reference point 1351, while VTR2 reference signal 1341 occurs at +40 ps from the same reference point.

In the example of FIG. 13, it is assumed that each receiver can tolerate a data input signal skew of −120 ps to +80 ps from a VTR signal pair. That is, a data input signal that occurs 120 ps before or 80 ps after the occurrence of a VTR signal pair is considered as properly aligned with that VTR signal pair. Also in the example of FIG. 13, each VTR signal pair is programmable to occur at five different locations in 80 ps intervals, and each data input signal is programmable to occur at three different locations also in 80 ps intervals. Table 1370 shows the results of testing the VTR signal pairs and the data input signals at various points in time using the previously described alignment monitoring circuits. Each row of Table 1370 indicates the VTR signal utilized for the alignment test. For example, row 1371 is for the test where the VTR1 signal is −160 ps from VTR1 reference signal 1340, row 1372 is for the test where the VTR2 signal is −160 ps from VTR2 reference signal 1341, etc. Each column of Table 1370 represents a data input signal at a particular point in time. For example, column 1381 is for the test where data input signal D1 is −80 ps from reference point 1351, column 1382 is for the test where data input signal D1 is at reference point 1351, column 1383 is for the test where data input signal D1 is +80 ps from reference point 1351, etc. Each cell of Table 1370 indicates whether a particular VTR signal is aligned with a particular data input signal. For example, cell 1391 indicates that a VTR1 signal that occurs −160 ps from VTR1 reference signal 1340 is aligned (i.e., passes the test) with a data input signal D1 that occurs at reference point 1351. As another example, cell 1392 indicates that a VTR2 signal that occurs −160 ps from VTR2 reference signal 1341 is aligned with a data input signal D1 that is +80 ps from reference point 1351.

From the results shown in Table 1370, several viable combinations of VTR signals and data input signals can be found. One possible combination is a VTR1 signal at −160 ps from VTR1 reference signal 1340 used in conjunction with a data input signal D1 and a data input signal D2 that occur −160 ps from reference point 1351. Another combination is a VTR2 signal that occurs +120 ps from VTR2 reference signal 1341 used in conjunction with a data input signal D3 and a data input signal D4 that occur +80 ps from reference point 1351. Note that in this particular example, a VTR2 signal that occurs 40 ps from reference point 1351 cannot be aligned perfectly with either data input signal D3 or D4 because the aforementioned signals are only moveable in 80 ps increments.

The results of the alignment test are used to program the corresponding delay lines and VTR select registers. Although it is preferable to perform the alignment test and delay adjustment during start-up, they can also be performed during idle times to compensate for signal drift. The alignment tests of the present invention are simple enough to be performed quickly and with minimal impact to normal operations. For example, the alignment test and delay adjustment can be performed during DRAM refresh cycles of a memory system.

In another aspect of the present invention, the selection of the best VTR signal pair for a particular data input signal is automatically performed. Automatic selection of the best VTR signal pair is advantageous in applications where adjusting signals to occur at the most optimum time is too complicated. Automatic selection of the best VTR signal pair is also advantageous in applications where performing timing adjustments during start-up or in the middle of normal operation is either not desirable or does not provide reliable results. This aspect of the present invention is now described with reference to FIGS. 14 and 15.

Figure 14:
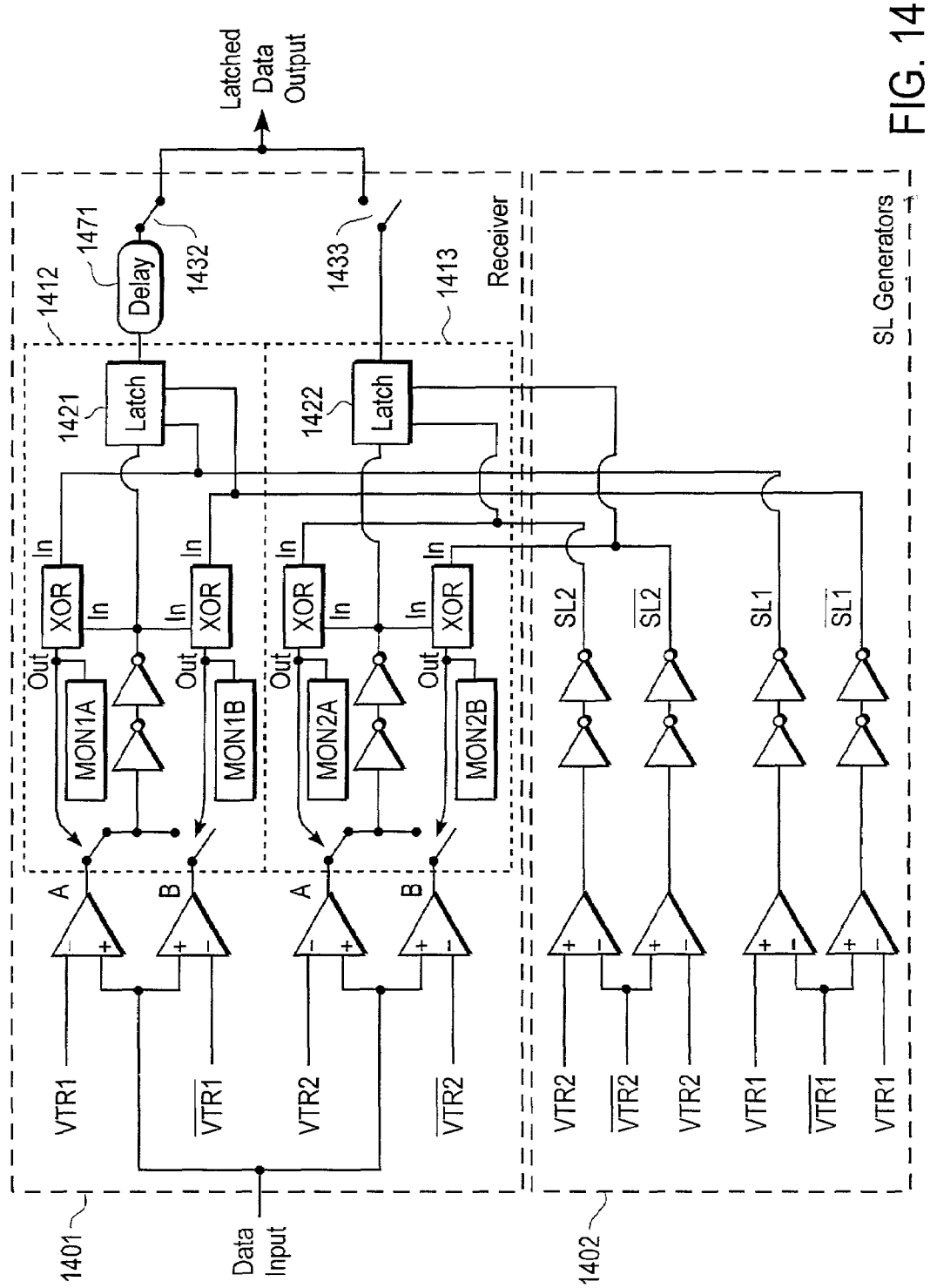
FIG. 14 shows a schematic diagram of a receiver in accordance with an embodiment of the present invention.

FIG. 14 shows a schematic diagram of a Jazio receiver 1401 in accordance with an embodiment of the present invention. Receiver 1401 employs Dual VTR Pair technique, and is similar in operation to receiver 1101 shown in FIG. 11. Except for the addition of a delay line 1471 and the automatic configuration of switches 1432 and 1433 in receiver 1401, receivers 1401 and 1101 are otherwise functionally the same. Delay line 1471, the value of which is pre-determined, is located forward of latch 1421 to normalize the delay between the VTR1 and VTR2 signal paths. A delay line may also be located forward of latch 1422.

Figure 15:
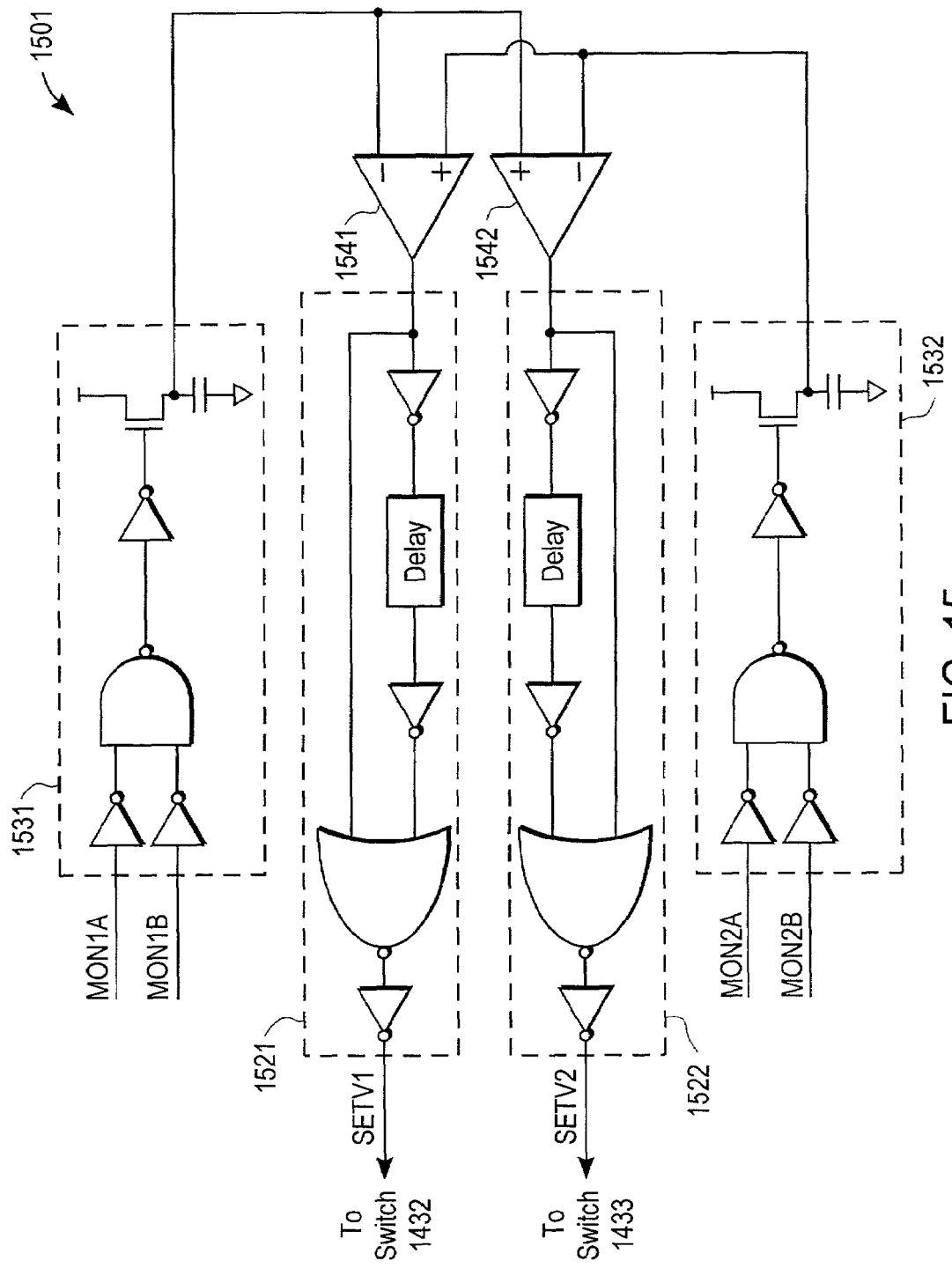
FIG. 15 shows a schematic diagram of an auto-select circuit in accordance with an embodiment of the present invention.

In receiver 1401, the closing and opening of switches 1432 and 1433, and hence the selection of the best VTR signal pair, are automatically performed during normal operation. FIG. 15 shows a schematic diagram of an auto-select circuit 1501 in accordance with an embodiment of the present invention. Auto-select circuit 1501 automatically controls switches 1432 and 1433 based on the alignment of the VTR signal pairs relative to the corresponding data input signal (thereby automatically selecting a better or best aligned VTR of two or more VTRs). Referring to FIG. 15, auto-select circuit 1501 includes an input section 1531 for receiving the outputs of alignment monitor circuits MON1A and MON1B, which monitor the alignment between the VTR1 signal pair and the data input signal. In auto-select circuit 1501, LOW outputs from both circuit MON1A and circuit MON1B indicate that the VTR1 signal pair is not aligned with the data input signal. This results in input circuit 1531 outputting a HIGH on the minus input of comparator 1541 and on the plus input of comparator 1542. The HIGH on the minus input of comparator 1541 causes make-before-break circuit 1521 to generate a SETV1 signal that opens switch 1432, thereby deselecting the VTR1 signal pair. At the same time, the HIGH on the plus input of comparator 1542 causes make-before-break circuit 1522 to generate a SETV2 signal that closes switch 1433, thereby selecting the VTR2 signal pair.

If the output of either circuit MON1A or MON1B is HIGH (indicating that the VTR1 signal pair and the data input signal are marginally aligned), or if the outputs of both circuit MON1A and MON1B are HIGH (indicating that the VTR1 signal pair and the data input signal are properly aligned), then input circuit 1531 outputs a LOW. The LOW output from input circuit 1531 allows circuit 1521 to send a signal SETV1 that closes switch 1432, thereby selecting the VTR1 signal pair. (As indicated, capacitors can further be provided for filtering.)

Analogous to input circuit 1531, input circuit 1532 receives the outputs of alignment monitor circuits MON2A and MON2B to control switches 1432 and 1433, and thereby select the VTR signal pair best aligned with the data input signal.

In receiver 1401, it is possible for both switches 1432 and 1433 to be closed when both the VTR1 signal pair and the VTR2 signal pair are aligned with the data input signal. In that case, the output of receiver 1401 will be the same as if only one switch is closed as long as the VTR signal pairs are reasonably aligned with each other (as is the case when appropriate delays are in place). Additionally, break-before-make circuits 1521 and 522 allow for some overlap between the VTR signal pairs, and thus help receiver 1401 to operate properly when switches 1432 and 1433 are both closed.

An improved method and system for deskewing parallel bus channels have been disclosed. While specific embodiments have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A system for data communications comprising:
    a transmitter group, the transmitter group being coupled to a plurality of channels;
    a plurality of programmable delay circuits coupled individually to each of the plurality of channels, each programmable delay circuit for each specific channel being programmed with a delay value based on the relative alignment of a data input signal transmitted on the specific channel; and
    a plurality of receivers, each receiver comprising:
        a first differential amplifier for receiving a data input signal on a first channel and a first reference signal on a second channel;
        a second differential amplifier for receiving the data input signal on the first channel and a second reference signal on a third channel, the second reference signal being a complement of the first reference signal, wherein the first reference signal and the second reference signal are common to the plurality of receivers; and
        a steering logic coupled to switch the output of either the first differential amplifier or the second differential amplifier to an output node depending on whether the data input signal has changed state.

2. The system of claim 1 wherein each receiver further comprises:
    a first latch coupled to a logic circuit that performs an exclusive-OR operation on the output of the receiver and a delayed version of the first reference signal;
    a second latch coupled to a logic circuit that performs an exclusive-OR operation on the output of the receiver and a delayed version of the second reference signal; and
    a logic circuit that detects the logic state of the first latch and the second latch.

3. The system of claim 1 wherein each receiver further comprises:
    a first latch coupled to a logic circuit that performs an exclusive-NOR operation on the output of the receiver and a delayed version of the first reference signal;
    a second latch coupled to a logic circuit that performs an exclusive-NOR operation on the output of the receiver and a delayed version of the second reference signal; and
    a logic circuit that detects the logic state of the first latch and the second latch.

4. A method for deskewing signals on parallel channels comprising:
    providing a plurality of channels, the plurality of channels carrying a plurality of data input signals and a pair of complementary reference signals;
    providing a plurality of receivers, each receiver receiving a data input signal and the pair of complementary reference signals;
    in a receiver, receiving a series of data input signals on a first channel;
    monitoring the alignment of the received series of data input signals relative to the pair of complementary reference signals; and
    adjusting the skew on the first channel based on the results of the alignment monitoring.

5. The method of claim 4 wherein the skew on the first channel is adjusted by programming a programmable delay circuit coupled to the first channel.

6. The method of claim 4 wherein the act of adjusting the skew on the first channel is performed during start-up of a device that includes the plurality of receivers.

7. The method of claim 4 wherein the act of adjusting the skew on the first channel is performed during idle periods of a device that includes the plurality of receivers.

8. A method for deskewing signals on parallel channels comprising:
    providing a plurality of channels, the plurality of channels carrying a plurality of data input signals, a first pair of complementary reference signals, and a second pair of complementary reference signals;
    providing a plurality of receivers, each receiver receiving a data input signal, the first pair of complementary reference signals, and the second pair of complementary reference signals;
    for each receiver:
        testing the alignment between data input signals received on a first channel, the first pair of complementary reference signals, and the second pair of complementary reference signal;
        selecting a complementary reference signal best aligned with the data input signals received on the first channel; and
        differentially comparing data input signals received on the first channel with the selected complementary reference signal.

9. The method of claim 8 wherein the act of testing the alignment is performed prior to normal operation of a device that includes the plurality of receivers.

10. The method of claim 8 wherein the act of selecting a complementary reference signal is performed automatically.

11. The method of claim 8 further comprising: adjusting the skew on the first channel by programming a programmable delay circuit.

* * * * *